(12) United States Patent
Arnold et al.

(10) Patent No.: US 7,443,693 B2
(45) Date of Patent: Oct. 28, 2008

(54) ELECTROMAGNETIC INTERFERENCE SHIELDING FOR A PRINTED CIRCUIT BOARD

(75) Inventors: Rocky R. Arnold, San Carlos, CA (US); John C. Zarganis, Redwood City, CA (US); Fabrizio Montauti, Pleasanton, CA (US)

(73) Assignee: WaveZero, Inc., Sunnyvale, CA (US)

( * ) Notice: Subject to any disclaimer, the term of this patent is extended or adjusted under 35 U.S.C. 154(b) by 449 days.

(21) Appl. No.: 10/825,999

(22) Filed: Apr. 15, 2004

(65) Prior Publication Data

US 2004/0240191 A1    Dec. 2, 2004

Related U.S. Application Data

(60) Provisional application No. 60/462,902, filed on Apr. 15, 2003.

(51) Int. Cl.
*H05K 7/14* (2006.01)
*H05K 7/18* (2006.01)

(52) U.S. Cl. .................. 361/800; 361/794; 174/521

(58) Field of Classification Search ............ 361/815, 361/818, 800, 803; 174/52.3; 257/660
See application file for complete search history.

(56) References Cited

U.S. PATENT DOCUMENTS

| 4,658,334 | A | 4/1987 | McSparran et al. |
|---|---|---|---|
| 5,028,490 | A | 7/1991 | Koskenmaki et al. |
| 5,043,848 | A | 8/1991 | Rogers et al. |
| 5,639,989 | A * | 6/1997 | Higgins, III ............... 174/386 |
| 5,811,050 | A | 9/1998 | Gabower et al. |
| 6,377,475 | B1 | 4/2002 | Reis |
| 6,476,463 | B1 * | 11/2002 | Kaneko et al. ............. 257/660 |
| 6,624,353 | B2 | 9/2003 | Gabower |
| 6,643,918 | B2 | 11/2003 | Ortiz et al. |
| 6,686,649 | B1 * | 2/2004 | Mathews et al. ........... 257/659 |
| 6,732,908 | B2 * | 5/2004 | Furman et al. ........ 228/180.22 |
| 6,768,654 | B2 | 7/2004 | Arnold et al. |
| 2001/0033478 | A1 | 10/2001 | Ortiz et al. |

FOREIGN PATENT DOCUMENTS

WO    WO 01/28305    4/2001

OTHER PUBLICATIONS

U.S. Appl. No. 09/685,969, filed Oct. 10, 2000, Janik et al.
U.S. Appl. No. 10/789,176, filed Feb. 26, 2004, Zarganis et al.
US 5,639,898, 06/1997, Higgins (withdrawn)

* cited by examiner

*Primary Examiner*—Dean A. Reichard
*Assistant Examiner*—Abiy Getachew
(74) *Attorney, Agent, or Firm*—Townsend and Townsend and Crew LLP

(57) ABSTRACT

The present invention provides shielded printed circuit boards and electronic devices. The printed circuit board may comprise an internal network of grounded conductive elements that are coupleable to an EMI shield that is mounted on the printed circuit board. The network of grounded conductive elements are coupleable to a grounded layer and to the EMI shield and provides improved EMI shielding through the volume of the printed circuit board below an electronic component mounted on the printed circuit board.

37 Claims, 15 Drawing Sheets

ELECTROMAGNETIC INTERFERENCE SHIELDING FOR A PRINTED CIRCUIT BOARD

CROSS-REFERENCES TO RELATED APPLICATIONS

The present application claims benefit to provisional U.S. Patent Application Ser. No. 60/462,902, filed Apr. 15, 2003, the complete disclosure of which is incorporated herein by reference.

The present invention is also related to U.S. patent application Ser. No. 10/825,747, filed herewith, and entitled "EMI Shielding for Electronic Component Packaging," the complete disclosure of which is incorporated herein by reference

BACKGROUND OF THE INVENTION

The present invention generally relates to shielded electronic devices and printed circuit boards. More specifically, the present invention provides an EMI shield coupled to a surface of the printed circuit board and an EMI shield that is formed within the printed circuit board.

Electronic products emit electromagnetic radiation, generally in the range of 50 MHz to 3 GHz, but not limited to this range, especially in light of the many advances in high-speed microprocessor design and the rapidly increasing capabilities of high-speed networking and switching. The problem of emittance of electromagnetic radiation is not new to designers of electronic equipment. Indeed, significant efforts are taken to reduce electromagnetic interference (EMI) and virtually every county has a regulating agency (FCC in the U.S., for instance) that regulates the marketing and sale of electronic equipment that do not pass stringent requirements for EMI, whether radiation is emitted or intercepted (also called susceptibility) by the electronic equipment Conventional EMI shielding solutions include the use of conductively painted plastic outer housings, conductive gaskets, and metal cans that are affixed to the printed circuit board by soldering or similar methods. In virtually all cases, the existing solutions are expensive and add to the cost of manufacturing electronic equipment such as cell phones, personal digital assistants, laptop computers, set-top boxes, cable modems, networking equipment including switches, bridges, and cross-connects.

More recently, technology for the metalization of polymer substrates has been attempted. For example, Koskenmaki (U.S. Pat. No. 5,028,490) provides a polymer substrate that is layered with aluminum fibers and sintered to form a flat material with a metal coating that is intended to provide effective EMI control (also a legal requirement of the FCC and other foreign entities and generally referred to as electromagnetic compliance or EMC). Unfortunately, the material has proven to be expensive, difficult to use, and subject to inferior performance due to cracking of the aluminum fiber layer. The Koskenmaki aluminum fiber metal layers had limitations on the ability to withstand a thermoforming process due to the typical tight radius used in the thermoforming molds.

U.S. Pat. No. 5,811,050 to Gabower, the complete disclosure of which is incorporated herein by reference, has provided an alternative approach wherein the thermoformable substrate (any number of different kinds of polymers) is first formed then metalized. This approach offers the advantage of not subjecting the metallized layer to the stresses created during molding. The product has been shown to be highly effective and relatively low-cost.

The major methods of providing for a conductive coating or layer on a substrate include (1) selective electroless copper/nickel plating, (2) electroless plating, (3) conductive paints and inks, and (4) vacuum metalization. Collectively, these are referred to herein as "metalization methods." In each of these applications, either a planar or formed substrate of metal or plastic is "treated" to form a conductive shield. The ultimate quality, performance, and cost for each method varies widely but ultimately a metalized thermoformable shield is formed into an (1) integral solution that surrounds the printed circuit board in some manner (e.g., "enclosure" level solution), (2) formed into a compartmentalized shield that fits on the surface ground traces of the PCB (e.g., "board" level solution), or (3) formed into smaller shields that fit over individual components again using the surface ground traces (e.g., "component" level solution).

When it comes to EMI shielding at the printed circuit board at the component level, the conventional solution is to place a conductive surface of an EMI shield in contact with the surface ground traces either (1) directly by metalizing a shield surface and placing it in contact with the ground trace or (2) by metalizing the "outside" surface (from the perspective of the component being shielded) and then using some method of attachment that connects the ground trace with the metalized outside surface. The purpose of the surface ground traces, based upon the historical use of soldered metal cans, is to provide a point of contact between the metal can and printed circuit board that can be subject to standardized surface mount technology (SMT) solder reflow processes that ultimately provide a solid and permanent connection between the metal can shield and the printed circuit board. While the metal can and surface ground trace become grounded in at least one point to the ground plane, the amount of peripheral contact between the shield and metal can is largely for the purpose of achieving a tight mechanical seam.

The resultant assembly of the shield onto the PCB provides adequate shielding for electronic components such as integrated circuits, oscillating clock chips and similar devices in numerous applications. However, as the frequency of chips increase (e.g., greater than 1 GHz) and the data transmission rates increase, the creation of errant EMI radiation becomes much easier and more harmful to circuits and components located nearby. Indeed, with the increasing density of chips, the subject of immunity (of one chip relative to another) becomes all the more important. Thus, in general, conventional solutions will increasingly find themselves inadequate for purposes of immunity and indeed, radiated emissions, may also become an increasing issue. Moreover, for microwave devices, especially those that operate of have harmonic frequencies above about 10 GHz., radiated emissions will be a significant concern.

Improving the EMI performance of the metallized thermoform requires an examination of the structure of the shield/board interface. FIG. 1 illustrates a conventional shielding solution in which a PCB 10 with an emitting electronic component 12, such as a semiconductor chip, and EMI shield 14 are depicted (not to scale). The EMI shield 14 is placed on surface ground traces 16 on the surface of the PCB through soldering that provide for electrical continuity. Radiation 18 from the chip can emerge through the PCB substrate (glass/polymer structure, as for instance, flame retardant 4 layer board—e.g., FR4). In FIG. 1, radiation 18 is shown as bouncing off a ground plane 20 and emerging either into the environment or adjacent to another chip (not shown). It should be appreciated that the radiation fields are comprised of very complex combinations of both electric and magnetic fields that are bouncing off chip and shield structures forming very complex fields with many resonances. These resonances can be very strong in terms of field strength and can easily be observed at frequencies that are troublesome from an EMC perspective.

In general, as can be seen in FIG. 1, there is nothing in the conventional shielding solution to contain the radiation escaping from the bottom of the chip 12 and through the PCB 10 except for the phenomena of partial reflection from the ground plane 20 (sometimes referred to herein as an "image" plane) which can, in some situation, improve the radiation emissions problem but is problematical from a design and manufacturing point to achieve.

Therefore, what are needed are improved methods and EMI shields for preventing radiation from escaping from the bottom of the chip and through the PCB.

BRIEF SUMMARY OF THE INVENTION

The present invention relates generally to improved shielding of electronic components on a printed circuit board.

In one aspect, the present invention provides a shielded printed circuit board (PCB). The shielded printed circuit board comprises a PCB comprising a first surface and a second surface. A metallized polymer shield is coupled to the first surface of the PCB. A grounded layer is coupled to the second surface of the PCB. A plurality of conductive vias extend from the first surface to the grounded layer so as to electrically couple the metallized polymer shield to the grounded layer.

The plurality of conductive vias may strategically be formed in a pattern through the printed circuit board so as to reduce the amount of electromagnetic interference that is able to pass through the printed circuit board. Preferably, the vias are spaced from each other no more than about ½ to about ¼ of a wavelength of a highest frequency or harmonic frequency of the electromagnetic interference of an electronic component on the printed circuit board. As such, depending on the electronic component, the vias may be spaced between about 1 mm and 200 mm from each other.

The combination of the grounded layer(s) and network of vias creates a three-dimensional EMI shield formed within the volume of the printed circuit board beneath and around the electronic component. When the metallized polymer shield is coupled to the first surface of the printed circuit board and in contact with the vias, the electronic component may be completely surrounded by a grounded EMI shield.

The metallized polymer shield of the present invention may take a variety of forms. Typically, the metallized polymer shield comprises one or more metal layers on one or more surfaces. In one embodiment, the metallized polymer shield comprises a shaped polymer substrate that defines a cavity that is sized and shaped to receive an electronic component. The shaped polymer substrate typically comprises a top surface and a plurality of side walls that extend at an angle from the top surface. A flange may be coupled to the side walls and will extend in a direction that is substantially parallel to the first surface of the printed circuit board. The flange, top surface, and side walls will be metallized along at least one surface. The flange may optionally comprise a plurality of openings so as to receive a conductive or non-conductive element for coupling the flange to the printed circuit board.

The metallized polymer shield may be permanently or removably attached to the first surface of the printed circuit board. In some embodiments, the printed circuit board will have a surface ground trace for attaching the metallized polymer shield. In other embodiments, the metallized polymer shield may directly contact the plurality of vias.

The metallized polymer shield may be coupled to the printed circuit board with a conductive element or a non-conductive element. For example, a mechanical connector, a conductive or non-conductive adhesive may be used to attach the metallized polymer shield to the first surface of the printed circuit board. In any of the embodiments, a conductive surface of the metallized polymer shield will have an electrical connection to the vias.

The grounded layer in the printed circuit board may be a ground plane, or it may be a plane that is electrically coupled to the ground plane. The grounded layer may be disposed between two layers of the printed circuit board, or the grounded layer may be disposed on an external surface of the printed circuit board.

In another aspect, the present invention provides a printed circuit board. The printed circuit board comprises a multi-layered substrate that comprises a first external surface and a second external surface, wherein a portion of the first external surface is configured to receive an electronic component. One or more internal grounded layers are disposed between adjacent layers of the multi-layered substrate. A network of conductive elements extend through at least a portion of the multi-layered substrate. The electrically conductive elements extend from at least one of the internal grounded planes to the first external surface. A shield is coupled to the first surface and is coupled to at least some of the conductive elements to provide an electrical grounding connection between the shield and the one or more internal grounded planes.

In one embodiment, the network of conductive elements comprise a plurality of conductively coated or filled vias. The spaces between adjacent vias comprise a largest dimension that is small enough to substantially reduce emission of electromagnetic radiation from the electronic component. Preferably, the largest dimension is no more than about ½ to about ¼ of a wavelength of a highest frequency or harmonic frequency of the electromagnetic interference of an electronic component on the printed circuit board. As such, depending on the electronic component, the vias may be spaced between about 1 mm and 200 mm from each other.

The printed circuit board may comprise a surface ground trace for coupling the conductive elements to the shield. A mechanical connector may be used to mechanically and/or electrically couple the shield to the ground trace and/or conductive elements. The mechanical connector may be a conductive adhesive, a non-conductive adhesive, a groove in the surface of the printed circuit board, or the like.

The shield may take a variety of forms. In one embodiment, the shield comprises a metal can. In other embodiments, the shield comprises a shaped metallized polymer shield.

In a further aspect, the present invention provides a method of shielding an electronic component on a printed circuit board (PCB). The method comprises providing a PCB that comprises an electronic component on a first surface of the PCB and one or more grounded layers, and a plurality of conductive vias that extend from the first surface to at least one of the grounded layers. A metallized polymer shield is coupled to the first surface of the PCB and around the electronic component to create an electrical connection to the conductive vias and the grounded layer(s). The electrical connection between the grounded layer(s), vias, and the metallized polymer shield forms a grounded EMI shield that substantially surrounds the electronic component.

The shield may be removably coupled to the first surface of the PCB. The shield may directly contact the conductive vias or it may contact a ground trace on the first surface of the PCB.

A connector, such as a conductive or nonconductive adhesive may be used to couple the shield to the vias. In embodiments in which the shield has a flange, openings may be created in the flange that correspond to the position of the vias. Thereafter, a conductive element may be placed over the openings to create a conductive path between a metal layer on the metallized polymer shield and the vias.

The present invention further provides electronic devices that encompass the improved printed circuit boards described herein.

A further understanding of the nature and advantages of the invention will become apparent by reference to the remaining portions of the specification and drawings.

DETAILED DESCRIPTION OF THE INVENTION

The present invention provides improved printed circuit boards, electronic devices, and EMI shielding, and methods of manufacturing the improved printed circuit boards, electronic devices, and EMI shielding.

Figure 2:
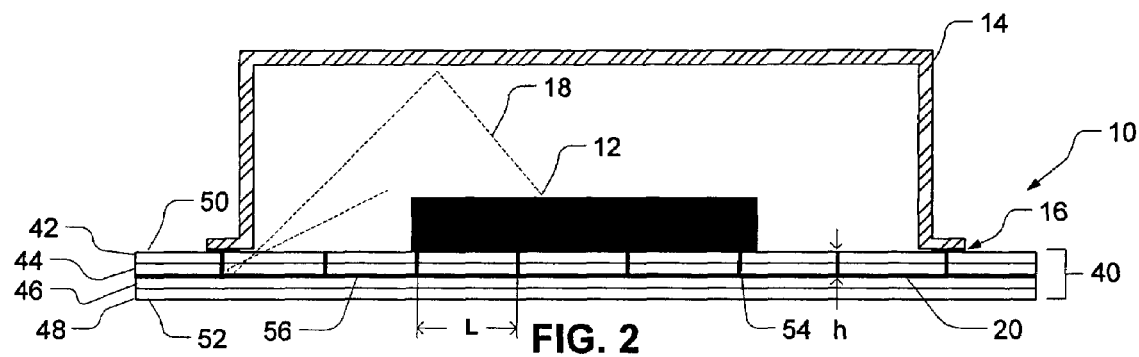
FIG. 2 is a cross sectional view that schematically illustrates one EMI shielding solution encompassed by the present invention that reduces the amount of electromagnetic radiation that escapes through the printed circuit board.
Figure 3:
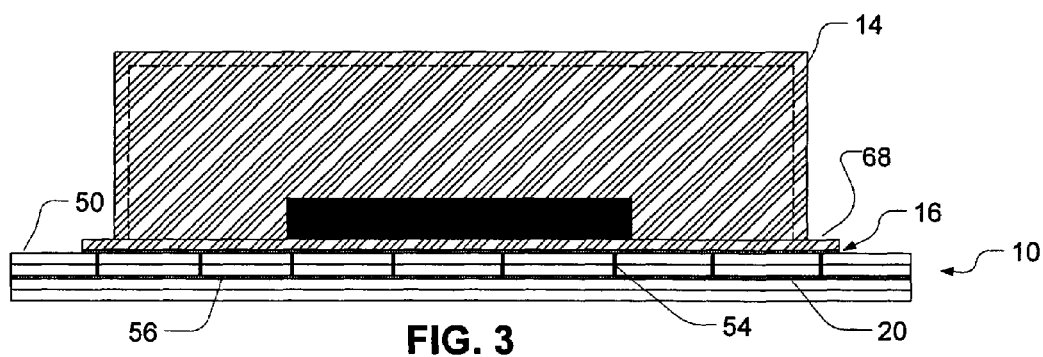
FIG. 3 is an elevational view that illustrates a flange of an EMI shield in contact with a surface ground trace and in electrical contact with a plurality of internal vias in the PCB.

FIGS. 2 and 3 illustrate a printed circuit board printed circuit board 10 that is encompassed by the present invention. Printed circuit board 10 comprises conductive traces superimposed or printed on one or both surfaces (not shown) and may also contain internal signal layers (not shown), power planes (not shown) and one or more ground planes 20. Printed circuit board 10 comprises one or more layers of insulative organic or inorganic material containing the pattern(s) of conductive traces. Printed circuit board 10 becomes an electrical circuit when electronic components 12 are attached to one of the printed circuit board's surfaces and leads from the electronic component are contacted with the conductive traces.

While printed circuit board 10 may be composed of a single epoxy sheet, most printed circuit boards of the present invention are composed of a two or more epoxy resin layers, and typically between two layers and sixteen layers, or more. As can be appreciated, the printed circuit board's 10 of the present invention may comprise hundreds of layers or more, if desired.

The substrate of the printed circuit board 10 typically comprises an insulative and substantially non-flexible substrate. The thin conductive traces or wires that are disposed on the surface of at least some of the substrate layers of the printed circuit board 10 may be formed from part of a copper foil that initially covers a surface of printed circuit board 10. The copper foil may be partly etched away, and the remaining copper forms a network of thin wires that form the conductive traces and provide the electrical connections between the various electronic components 12 mounted on the surface of the printed circuit board 10. As can be appreciated, the conductive traces may be formed on the surface of the substrate using any accepted method.

Some printed circuit boards 10 have electronic components 12 mounted on only a first surface of printed circuit board 10 and the conductive traces on the second surface. Double sided printed circuit boards 10 have conductive traces on both the first and second surfaces of the printed circuit board 10. If there are conductive traces on both surfaces of printed circuit board 10, an electrical bridge between the two surfaces may be needed. Such electrical bridges may comprise vias. A via is a hole in the printed circuit board 10 that is filled or conductively plated with metal or other conductive materials and extends through at least one layer of printed circuit board 10. While not shown in FIGS. 1 to 3, when there are multiple layers of conductive traces, printed circuit board 10 may comprise buried or blind vias that extend through less than all of the layers of printed circuit board.

To increase the number of conductive traces on the printed circuit board 10, two or more double-sided layers may be coupled together with insulating layers in between the layers. To more clearly show the novel aspects of the present invention, the figures only illustrate a one-sided board, but it should be appreciated that the present invention is equally applicable to double sided printed circuit boards.

In multi-layer printed circuit board 10, one or more layers may be dedicated to ground planes 20 and power planes (not shown). In some embodiments, there may be more than one of the power planes and/or ground planes 20. Moreover, there are often grounded layers within the printed circuit board that are electrically coupled to the ground plane 20.

Manufacturing of a printed circuit board 10 starts with a board of glass epoxy or similar substrate materials. After the conductive traces are formed one or both surfaces of the layer, if the printed circuit board 10 is a multiple layered board that has buried or blind vias, each via may be drilled and plated (or filled). After the vias are drilled in the printed circuit board, the inside of the vias may be plated or filled (sometimes referred to as plated through hole or PTH). The metallization of the vias inner walls creates an electrical connection through the board and to all conductive traces in the inner layers that contact the vias.

Single layers may be laminated together to form the multi-layer printed circuit board. Lamination involves gluing the layers together with an insulating film in between the adjacent layers of the printed circuit board. For vias that extend through all of the layers of the printed circuit board, the drilling and plating may be repeated. Once the multiple layers of the printed circuit board are laminated together, the electronic components 12 may be mounted to a surface of the printed circuit board 10 to create the electronic circuit.

The present invention provides a combination of an EMI shield 14, such as a metallized thermoform EMI shield, with a modified printed circuit board 10. Specifically, the present invention couples the EMI shield 14 to a grounded layer through portions of strategically positioned vias 54, and internal ground traces to form a non-solid ENMR "fence" that extends into the volume of the printed circuit board 10 beneath and around the electronic component 12.

While the remaining discussion focuses on metallized thermoform shields 14, it should be appreciated that the present invention is not limited to such EMI shields. For example, it may be possible to couple other types of EMI shields to the vias and/or surface ground trace. Other shields include, but are not limited to, metal cans, EMI shields as described by Koskenmaki (U.S. Pat. No. 5,028,490), EMI shields as described by Reis (U.S. Pat. No. 6,377,475 B1), or the like.

FIGS. 2 and 3 illustrates the structure of a shielded printed circuit board 10 that is encompassed by the present invention. Printed circuit board 10 may be comprised of a substrate 40 that has one or more substrate layers. In the illustrated embodiment, there are four substrate layers 42, 44, 46, 48, but as noted above, substrate 40 may comprise more or less substrate layers. Printed circuit board 10 defines a first external surface 50 and a second external surface 52. At least a portion of the first external surface 50 is configured to receive electronic component 12. For printed circuit boards 10 that are composed of multiple substrate layers, such as the embodiment of FIG. 2, the printed circuit board 10 defines an interface between adjacent substrate layers. The interface may comprise conductive leads, a power plane, a ground plane, a grounded layer, internal ground traces, or the like. Most multi-layer boards have one or more ground planes on different layers, which are connected by vias. As a result, multi-layered printed circuit board's may increase in overall thickness which may allow EMI radiation to escape out the edges of the printed circuit board. Proper spacing of the vias between the ground planes and the surface of the printed circuit board hinders the ability of radiation to escape out of the edges of the printed circuit board despite the increase in the overall thickness of a multi-layer printed circuit board.

Figure 2A:
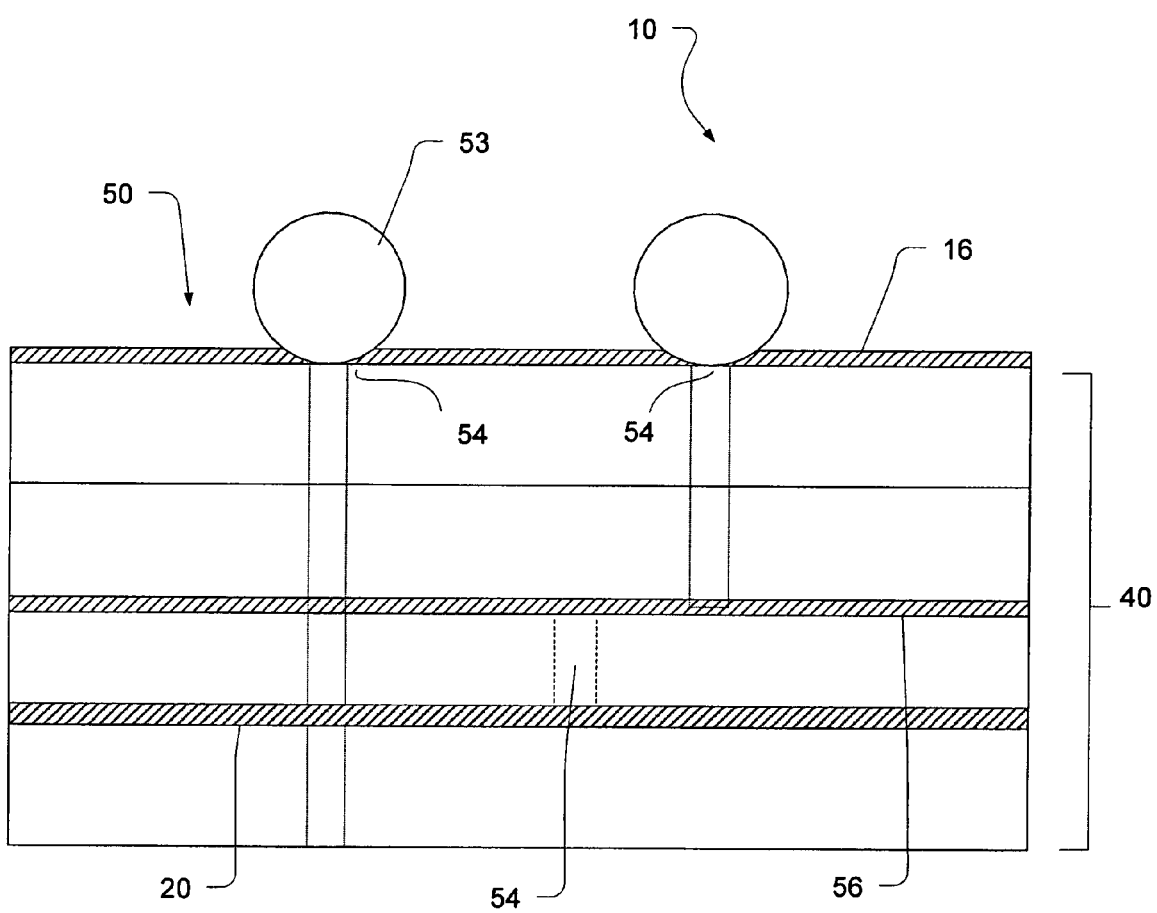
FIG. 2A schematically illustrates an electrical connection between a plurality of strategically spaced vias within a printed circuit board and a grounded layer.

Referring now to FIGS. 2, 2A, and 3, a plurality of conductive elements, typically in the form of conductively coated or filled vias 54 may be selectively formed in the layers 40 of the printed circuit board 10 so that at least some of vias 54 extend from a grounded layer 56 to first external surface 50 of printed circuit board 10. As can be appreciated, not all of the vias 54 in printed circuit board 10 need to extend to first external surface 50. Moreover, some of vias 54 may be used to interconnect one grounded layer 56 to another grounded layer, such as the ground plane 20. In the embodiment of FIG. 2, the grounded layer 56 is a ground plane 20 of the printed circuit board. In the embodiment of FIG. 2A, a grounded layer 56 is electrically coupled to ground plane 20 through via 54.

Depending on the configuration of the printed circuit board, the plurality of vias 54 may be electrically coupled to different grounded layers. As can be appreciated, vias 54 differ from the vias that connect the conductive leads on one surface of the printed circuit board to the conductive leads on an opposite surface of the printed circuit board. Vias 54 will not be in contact with any of the conductive traces, but will instead provide an electrical connection between an internal grounded layer 56 and the EMI shield 14.

Typically, vias 54 extend substantially orthogonal from a plane of the first surface 50 of the printed circuit board 10 to the grounded layer 56 and are formed using conventional methods. Vias 54 may be created in the layers of printed circuit board 10 so that one end of the via extends to the first external surface 50 to provide a topside surface to which an electrical connection to the EMI shield 14 is possible. At least a portion of the conductive via 54 may be in contact with grounded layer 56. Consequently, when an EMI shield is conductively contacted with the via 54 on the first external surface 50, the EMI shield 14 will be grounded.

Vias 54 are preferably created in the layers 42-48 of printed circuit board 10 in a pattern so as to reduce the amount of electromagnetic radiation from escaping through the network of vias. The network of vias 54 usually provides between as few as about four vias and as many as several hundred vias that extend from the first surface 50 down to a grounded layer around each electronic component. Typically, the vias 54 will be formed in a shape that corresponds to the shape of the perimeter of the shield, so as to provide a via-shield grounding contact along the perimeter of EMI shield 14. Thus, the shape of the network of vias 54 and ground plane will depend on the shape of the corresponding EMI shield (e.g., if the shield perimeter is round, the vias will be positioned in a circle around the electronic component; if the shield perimeter is rectangular, then the vias 54 will be positioned in an independent rectangle around the electronic component).

The number of vias utilized may be determined by the operating frequency of the electronic component or any harmonic frequencies thereof. In the case of higher operating frequencies, too few vias would potentially allow radiation to leak through in between the vias 54. At higher frequencies, wavelengths of the radiation are shorter and are able to leak out in between smaller spaces. Therefore, if there are too few vias54, then the vias will be spaced further apart from one another and would allow for more radiation to leak through.

Vias 54 are inherently capacitive and may change the desired impedance of the conductive traces they encounter. Too many vias 54 could distort data or transmissions traveling across the traces or could possibly affect rise times (time require for a pulse to change from a low voltage level to a high voltage level). However, some experiments have shown that the effect of the first via 54 added is great, but the impact of subsequent vias 54 tends to diminish as more vias are added.

The number and locations of the vias 54 may be based according to the operating frequencies of the electronic components within the electronic device that is being shielded. Preferably, the vias 54 are placed a distance apart from one another that is approximately equal to between about ½ and about ¼ of the wavelength of the highest frequency or harmonic thereof to create an effective shield and prevent radiation from leaking out from between the vias 54. For example, the adjacent vias 54 may be spaced apart between about 1 mm and about 200 mm, depending on the wavelength of the highest frequency.

Typically, vias 54 are plated with copper, nickel, gold, silver, tin or solder (typically tin/lead combo) and the like. Vias 54 are generally plated through an electroless or an electrolytic plating process. The plating can extend through the vias 54 and be exposed on the flat surfaces of the printed circuit board which would allow a small ringlet of the conductive surface of the via 54 to be exposed and allowed to make contact with the EMI shield or ground trace.

The diameters of vias 54 can range between 0.015" and 0.040" in some cases. The smaller the diameter of the vias54, the more expensive it typically is to manufacture the printed circuit board. In addition, if the via 54 diameter is too small, it would be difficult to conductively plate the entire depth of the via. On the other hand, if the diameter of the via 54 is too large, when solder is applied to the printed circuit board it may well up and create a bump of solder on the board, which can be undesirable. Also, if the via diameter is too big, when the non-conductive solder mask is applied, it could drape into the via 54, thereby creating a depression in the printed circuit board which may also be undesirable.

The number of the vias 54 positioned along each side of an EMI shield would depend on the operating frequency of the components being shielded. The higher the frequency, the closer the vias 54 would be placed together and therefore the more vias would be placed along each side of the shield. The height of the vias 54 is dependant on the number of layers on the printed circuit board and how many layers the via would need to pass through to reach the grounded layer 56 (e.g., ground plane 20). For instance, a 4 layer printed circuit board is typically 0.064" thick total (~0.016" per layer). Vias 54 could pass between 1 layer or between all 4 layers. This same would hold true for printed circuit board with higher numbers of layers. FIG. 2A schematically illustrates vias 54 that extend through the entire printed circuit board 10 and vias 54 that extend through only a portion of the printed circuit board. Vias 54 are in electrical connection to grounded layer 20 and a solder or conductive adhesive bump 53 that may be coupled to EMI shield (not shown).

Vias 54 may be electrically coupled to one or more surface ground traces 16 and/or internal grounded layers 56. Grounded layer 56 may be a ground plane 20 of the printed circuit board or it may be an internal layer, trace, or a portion of a layer that is electrically coupled to the ground plane 20. As can be appreciated, printed circuit board 10 may comprise one or more ground planes 20. The grounded layer may be grounded (e.g., coupled to the ground plane with buried vias or blind vias) through any conventional or proprietary methods. For example, in an embodiment in which ground plane is coupled to a bottom substrate layer 48 (or other substrate layer), printed circuit board 10 may comprise an intermediate grounded layer 56 in which some or all of vias 54 are coupled to the grounded layer 56. Thereafter, one or more vias 54 may electrically couple the intermediate grounded layer 56 to the ground plane 20.

As shown in FIGS. 2 and 3, the plurality of vias 54 form an interconnected network of spaced conductive elements that extend throughout the inner structure of printed circuit board 10 to form an open, mesh-like EMI shield for the electronic component 12. When connected with an external EMI shield 14, the combination provides an EMI shield that substantially wholly surrounds a volume of the printed circuit board beneath electronic component 12 and reduces the emittance of electromagnetic radiation to surrounding electronic components. In both embodiments, the top of the EMI shielding is substantially solid (though EMI shield 14 may contain ventilation holes). While the bottom portion (e.g., the conductive vias and grounded layer) is not "solid," but is more of a mesh or cage and the spacing between the vias are small enough to substantially reduce the amount of electromagnetic interference that would escape.

Optionally, printed circuit board 10 may comprise surface ground traces 16 that are positioned on the first surface 50 of printed circuit board 10 so as to substantially surround the electronic component 12. The EMI shield 14 may be coupled to the surface ground trace 16 so as to electrically couple the EMI shield 14 to the grounded layer(s) 56. A connector may be used to fixedly or releasably couple EMI shield to the ground trace 16. Co-pending and commonly owned U.S. patent application Ser. No. 10/789,176, filed Feb. 26, 2004 and entitled "Methods for Grounding an EMI Shield to a Printed Circuit Board," the complete disclosure of which is incorporated herein by reference, describes some connectors that may be used to couple the EMI shield 14 to the ground trace.

For many smaller electronic devices (cell phones, PDA's etc.) the surface ground traces 16 are generally between 1 mm and 2 mm wide (~0.040" to 0.080"). However, ground traces could be 4 mm (0.160") wide or greater in some cases of larger electronic devices. The vias 54 could be positioned at any location along the width of the ground trace 16 although they are generally centered along the width.

Figure 4:
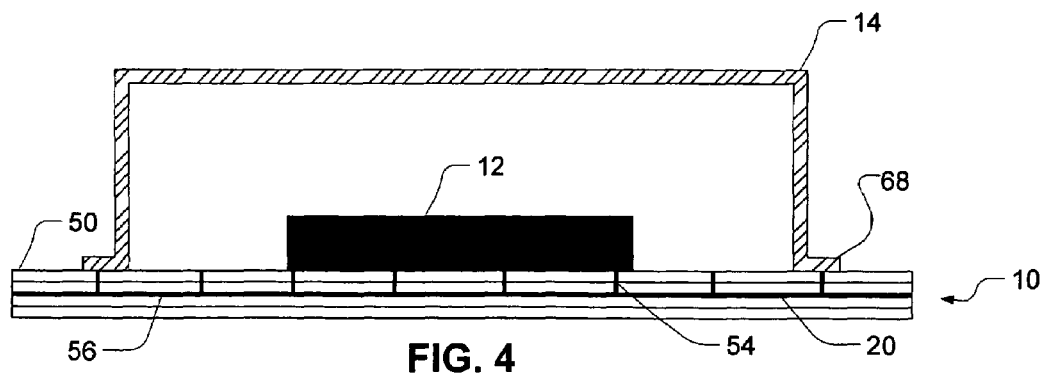
FIG. 4 schematically illustrates another EMI shielding solution encompassed by the present invention in which the printed circuit board does not have a surface ground trace.

However, as shown in FIG. 4, the present invention also encompasses a printed circuit board 10 in which the surface ground traces are removed, and the EMI shield 14 makes direct contact with an upper end portion of the vias 54. The benefit of such an embodiment would be to utilize the area that would normally be taken up by the surface ground traces. By removing the surface ground trace which can be between 0.040"- 0.080" wide and contacting EMI shield 14 directly to the vias (which have a diameter~0.028") saves approximately 0.012" to 0.52" of printed circuit board area which could be used for component placement or to reduce the overall dimensions of the printed circuit board.

In this particular embodiment, metallized surface of EMI shield 14 would directly contact the metallized surface of the vias 54 which generally have a portion of the plated metal coating extending onto the flat surface 50 of the printed circuit board. To enhance the electrical connection between the metallized flange 68 and the via 54, small dimples or depressions may be formed into the flange that will align and mate with the via locations. The dimple may optionally extend into the inner diameter of the vias.

An alternative method of attaching and grounding EMI shield 14 to the vias 54 would be to use conductive materials or adhesives to attach EMI shield 14 in the proper orientation and location to make proper electrical connection to the vias. This would allow for the use droplets of adhesive on the locations of the vias 54 and place the EMI shield 54 onto the droplets thereby making the electrical connection between EMI shield 14 and the vias 54.

Alternatively, the droplets of adhesive may be placed on EMI shield 14 in a pattern that corresponds to the vias and then place the adhesive coated EMI shield 14 onto the printed circuit board. While not essential, it is beneficial for EMI shield 14 electrically contact as many exposed vias 54 in the required area to be shielded as possible to minimize the distance between the electrical contacts between the EMI shield and grounded layer. As noted above, large gaps between electrical connections can allow EMI radiation to pass through EMI shield 14.

Figure 1:
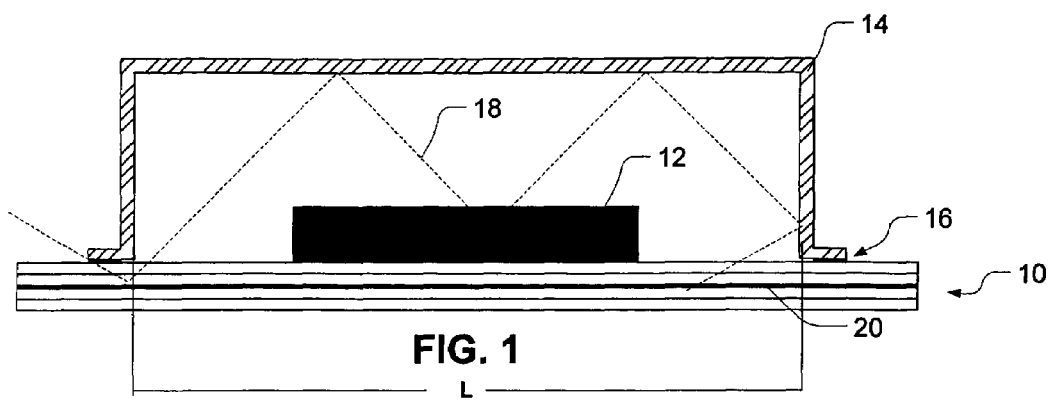
FIG. 1 is a cross-sectional view that schematically illustrates one conventional EMI shielding solution in which electromagnetic radiation may escape through the printed circuit board.

While electromagnetic radiation fields are very complex, the behavior of an EMI shield can be determined from a measurement of shielding effectiveness (SE). It is known from slot antennae theory (for radiating) and aperture theory (for shielding) that electromagnetic radiation may be controlled by the dimensional qualities of the surrounding shielding structure. As shown in FIG. 1, it may be observed that the bottom side of the EMI shield 14 (beneath the electronic component 12) comprises a topology that is basically open. Such an EMI shield 14 is roughly equivalent to a slot antenna with a length of L where L is the length of the EMI shield 14. Simplistically, the SE of a structure of this type is as follows:

$$SE(dB) = 100 - 20 \log[d \cdot F] + 20 \log[1 + Ln(d/h)]$$

d is the aperture length (in millimeters—which extends into the page),

F is the frequency of the emitted electromagnetic radiation (in MHz.), and h is the aperture height (in millimeters). For the situation of FIG. 1, d=L and d/h is very large.

Thus, $SE_{1a}(dB) = 100 - 20 \log[L \cdot F] + 20 \log[1 + Ln(L/h)]$

For the situation of FIG. 2, d=L/n where n is the number of intermittent vias 54 located along the periphery of the EMI shield 14.

Thus, $SE_{1b}(dB) = 100 - 20 \log[(L/n) \cdot F] + 20 \log[1 + Ln((L/n)/h)]$

It is evident that the SE of the FIG. 2 design is greater than that of the FIG. 1 design. As an example, for L=25.4 mm (1 inch), h=0.8 mm (0.031 inch), n=4, and F=500 MHz., the following is obtained: $SE_{FIG.}1 = 30.9$ dB and $SE_{FIG.}2 = 39.7$ dB. Thus, with simple theory, the proposed design of FIG. 2 provides 8.8 dB of SE improvement (about a 63% improvement).

Figure 5:
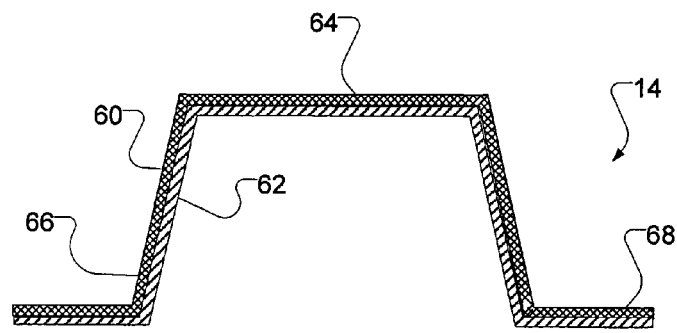
FIG. 5 is a cross sectional view of one EMI shield that is encompassed by the present invention.

FIG. 5 illustrates a simplified cross-sectional view of an EMI shield 14 that is encompassed by the present invention. EMI shield 14 may comprise one or more compartments that receive and shield the electronic component. In embodiments in which the EMI shield has multiple compartments for multiple electronic components, each of the compartments will be sized and shaped to separate the electronic components from each other. As such, the EMI shield 14 may take on a variety of shapes, sizes and forms so as to conform to the specific shape and configuration of the printed circuit board and electronic components being shielded. The EMI shields 14 of the present invention typically include a polymer or resin film layer 60 that can be formed by a variety of plastic processing methods to a desired shape to partially or fully enclose electronic component 12 on printed circuit board 10.

In exemplary embodiments, the resin film layer 60 is a thermoformable plastic that is shaped using thermoforming techniques (e.g., vacuum, pressure, or mechanical forces). It should be appreciated however, that the resin film layer 60 may be shaped using any conventional or proprietary methods. The resin film layer 60 of the EMI shield 14 typically has at least one metal layer 62 on at least one side of the resin film layer. Metal layer(s) 62 will have a thickness that is sufficient to block the transmission of EMI, typically between about 1 micron and about 50 microns.

The metal layers 62 of the present invention are typically applied to the resin film layer 60 after shaping of the resin film layer. If the metal layer 62 is applied prior to shaping of the resin film layer 60, the shaping process (e.g., thermoforming) tends to stretch out and weaken portions of the metal layer. Such stretching and thinning has been found to weaken and sometimes destroy the EMI shielding capabilities of the metal layer 62. The EMI shields 14 of the present invention will generally have a substantially even thickness in the metal layer that is sufficient to block the passage of EMI. A more detailed description of some embodiments of an EMI shield that may be used with the present invention is described in commonly owned U.S. Pat. No. 5,811,050 and commonly owned U.S. patent application Ser. No. 09/788,263, filed Feb. 16, 2001, U.S. patent application Ser. No. 09/947,229, filed Sep. 4, 2001, U.S. patent application Ser. No. 09/685,969, filed Oct. 10, 2000, and PCT Patent Application No. 00/27610, filed Oct. 6, 2000, the complete disclosures of which are incorporated herein by reference.

Typically, the metal film layer 62 is deposited onto one or more surfaces of the resin film layer 60 using vacuum metallization. While the illustrated embodiment shows a single metal layer on an inner surface of resin film layer 60, it should be appreciated one or more metal layers may be applied to at least one of the inner surface and the outer surface of the resin film layer 60. Vacuum metallization is one preferred method because of the substantially even layer of metal that can be applied to the shaped resin film layer 60 to create the EMI shield 14. It should be appreciated however, that other methods of depositing the metal layer to the substrate could be used without departing from the scope of the present invention. For example, instead of vacuum metallization, other methods such as a depositing a random mat or fiber weave, sputtering, painting, electroplating, deposition coating, electroless plating, laminated conductive layers, and the like, may be used to deposit the metal layer onto the shaped resin film layer. The metal layer 62 will typically be grounded to a ground plane 20 with a surface ground trace 16 and/or at least some of vias 54 so as to create a Faraday cage around the electronic component 12.

In the illustrated embodiment of EMI shield 14, the EMI shield comprises a top surface 64 and a plurality of sidewalls 66. A flange 68 may extend laterally from the plurality of side walls and extends in a plane that is substantially parallel with the first external surface 50 of printed circuit board 10. In preferred embodiments, the top surface, side walls and flange are metallized on at least one surface.

Metal can EMI shields may be coupled to surface ground trace 16 using a solder reflow process. However, since the polymer melt temperature of the resin film layer 60 is usually lower than the reflow temperatures, the reflow process is generally not applicable to resin based EMI shields. FIGS. 6 to 29 illustrate a plurality of non-limiting methods of mechanically coupling and grounding the polymer EMI shield 14 with the vias 54 and grounded layer 56.

Figure 6:
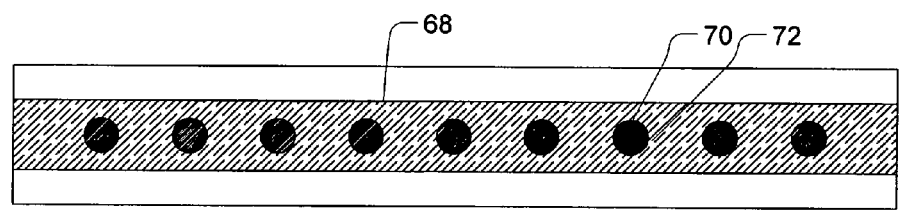
FIG. 6 is a top view of a flange of an EMI shield that has selectively spaced holes that may receive a conductive or non-conductive adhesive.

As shown in FIG. 6, if the metallized thermoform EMI shield 14 contains a flange 68, holes 70 may optionally be selectively placed on the flange 68 where either conductive or nonconductive adhesive 72 or similar conductive material (even solder) could be placed over the holes 70 to couple the flange 68 to the surface ground trace 16 and/or vias. Such a configuration is particularly beneficial when a metal layer 62 is placed on the outside surface of EMI shield 14 so that the conductive adhesive creates an electrical path to the metal layer on the outside surface of the EMI shield. Flange holes 70 or slots may be placed over the already conductively plated or filled vias 54 to achieve electrical continuity with the vias. The type of adhesive and its properties may be chosen to allow also for easy removal if repair of the underlying electronic circuits or components are required. One suitable adhesive is the 3M® PSA adhesive (3M part numbers 9713 and 9703).

While not illustrated, it should be appreciated that instead of selective placement of adhesive into holes 70, if desired, a substantially continuous line of adhesive may be placed onto the flange (e.g., between the flange and the printed circuit board or onto a upper surface of the flange) to mechanically and/or electrically coupled the flange to the surface ground trace 16 and/or vias 54.

Figure 7:
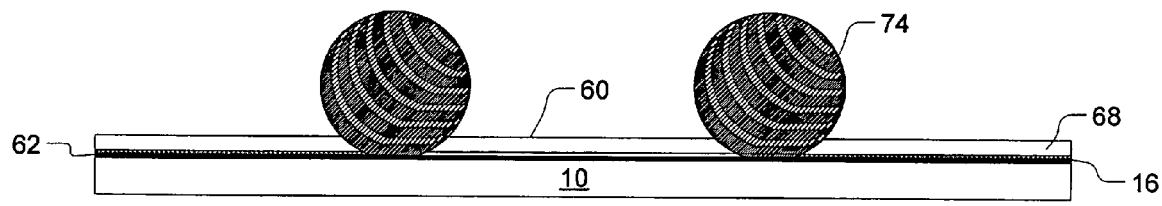
FIGS. 7 and 8 illustrate a ball of adhesive and a flattened ball of adhesive, respectively, that is positioned on a flange, and through strategically placed holes in the flange of an EMI shield of the present invention.
Figure 8:
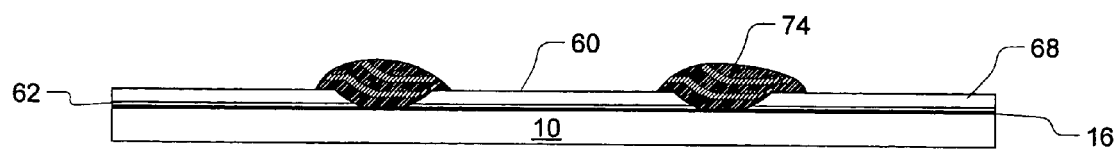

Referring now to FIGS. 7 and 8, adhesive balls 74 may be placed either before or after the EMI shield 14 is placed onto printed circuit board 10. Thus, the adhesive balls 74 may be positioned on top of the flange 68 or between the flange 68 and printed circuit board 10. Since EMI shield 14 does not have to have a total continuous peripheral electrical contact with the vias and/or ground trace 16, either conductive or nonconductive adhesive may be used. If desired, as shown in FIG. 8, the adhesive balls 74 may be flattened to reduce the profile of the adhesive ball.

Figure 9:
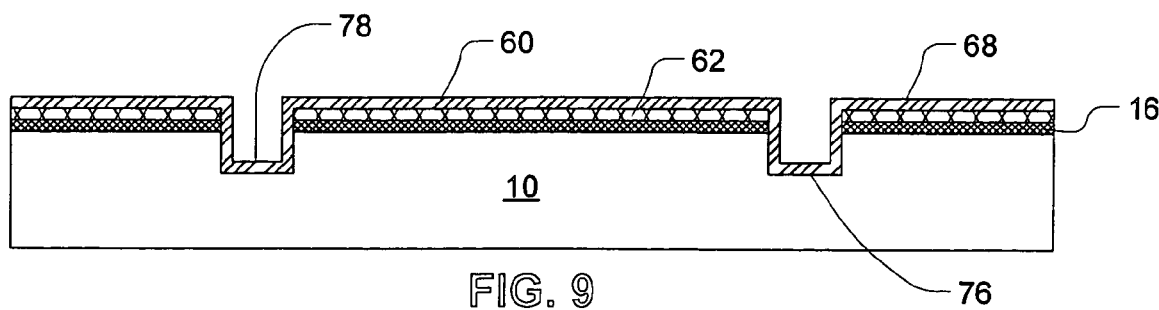
FIG. 9 is a cross-sectional view of a printed circuit board that has a female feature and an EMI shield that has a corresponding male feature for connecting the EMI shield to the printed circuit board.
Figure 10:
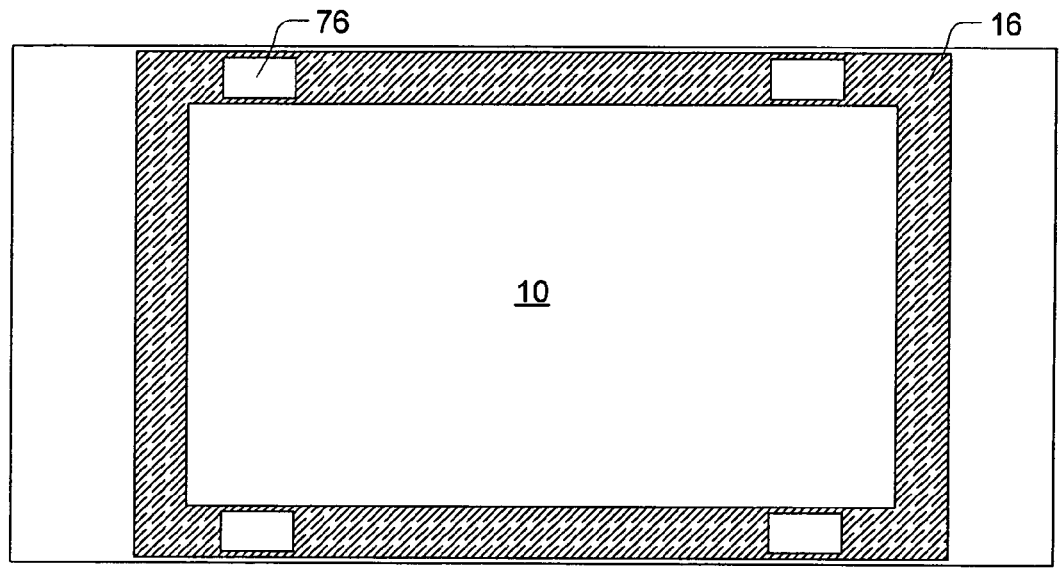
FIG. 10 is a top view that illustrates a plurality of female features in a surface ground trace on the printed circuit board.

As shown in FIGS. 9 and 10, in another embodiment, the printed circuit board 10 may be processed to have selective female features or recessed areas 76, such a one or more holes or grooves. The recessed area may be created using conventional methods, such as routing drilling, or etching. The female features 76 may optionally be plated so as to be conductive.

The metallized thermoform EMI shield 14 may then be formed to have corresponding male features or nubs 78 that extend into the recessed area 76 of the printed circuit board to provide a tight mechanical fit with the nubs 78 of the EMI shield 14. These features allows for improved connection between the ground trace, vias, and the EMI shield. As shown in FIG. 9, mechanical snapping of the nubs 78 to the recessed area 76, may provide surface to surface contact between the metal layer 62 of the EMI shield and the surface ground trace 16 around the electronic component along the first external surface of the printed circuit board. FIG. 10 shows how the mechanical features 76, 78 can be positioned on the surface ground trace 16 around a periphery of the electronic component. In other embodiments, however, such a configuration may provide electrical contact between the conductive vias and the EMI shield (not shown).

The nubs 78 may be placed at any desired interval along flange 68. In some embodiments, the nubs are positioned at distances that are sufficient to block the frequencies of interest, or the nubs 78 may be spaced to block a selective frequency. The number of nubs present would be selected based on the frequency of the electronic component to be shielded (similar to the vias, the higher the frequency, the more nubs would be placed closer together). Also, if the nubs are to provide both an electrical contact as well as be used for a mechanical connection to retain the shield in location, then the number of nubs and corresponding mechanical features 76 would be sized and placed accordingly to provide both enough grounding contact as well as enough mechanical retention.]

Figure 10A:
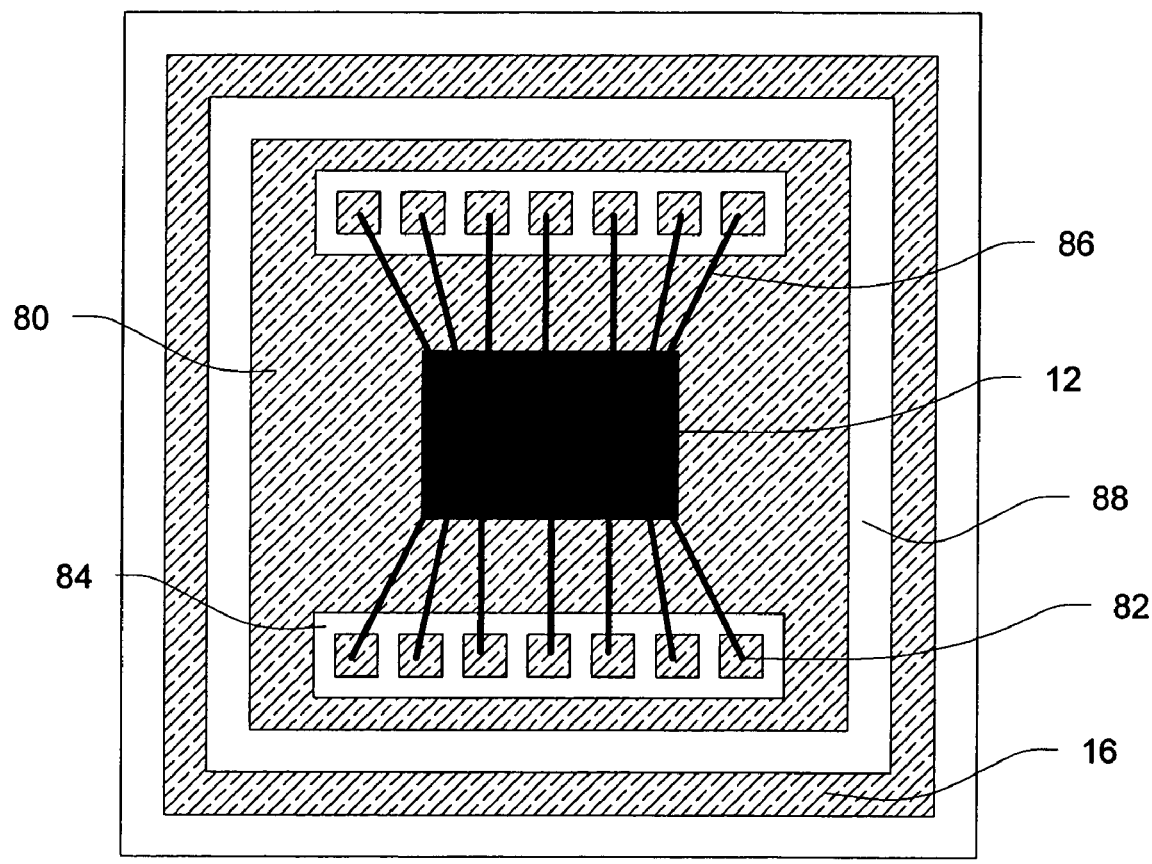
FIG. 10A illustrates another method of shielding the printed circuit board in which a conductive material is applied to a surface of the printed circuit board beneath and around the electronic component.

FIG. 10A illustrates another shielding solution that is encompassed by the present invention. The shielding solution illustrated in FIG. 10A may be used in addition to the network of vias or as an alternative to the network of vias. As shown in FIG. 10A, a portion of the surface of the printed circuit board beneath and around the electronic component 12 is plated with a conductive material 80, such as aluminum, copper, silver, gold, nickel, tin, or the like. Preferably, the conductive material 80 may be the same material as the ground trace 16. As can be seen, individual lead pads 82 may be positioned on the surface of the printed circuit board 10 and surrounded by a non-conductive surface 84 (such as the surface of the printed circuit board or another insulative material). As such, the lead frame 86 of the electronic component 12 may still contact the lead pads 82 on the printed circuit board 10, and the conductive material 80 will not interfere with the signal path or signal quality. While not shown, conductive material 80 may be in electrical contact with vias or other conductive elements that allow the conductive material to be grounded to a grounded layer.

If desired, the EMI shield (not shown for clarity) may be directly coupled to the conductive material 80 to ground the EMI shield. In such embodiments, the ground trace 16 will not be needed. In other embodiments, however, the EMI shield may be grounded to the ground trace 16 and may or may not be in contact with the conductive material 80. In embodiments where the EMI shield does not contact conductive material 80, conductive material 80 will be separated from ground trace 16 with an insulative space 88.

FIGS. 11 to 29 illustrate a variety of other connectors that may be used to connect the EMI shield 14 to the surface ground trace 16 and/or vias 54. In many embodiments of the present invention, the connectors allow for removable attachment of a flange of the EMI shield with a grounding portion (e.g., ground trace 16 or vias 54 on the printed circuit board). As can be appreciated, while the figures illustrate electrical and mechanical connection between a ground trace or a plurality of vias that extends around a perimeter of the electronic component, the present invention is not limited to such a grounding configuration. For example, the EMI shields of the present invention may be grounded to ground trace that does not extend around the entire perimeter of the electronic component, to a grounding eyelets on the printed circuit board used for screws that connect the printed circuit board down onto an enclosure or supporting frame, or other conventional grounding locations.

Figure 11:
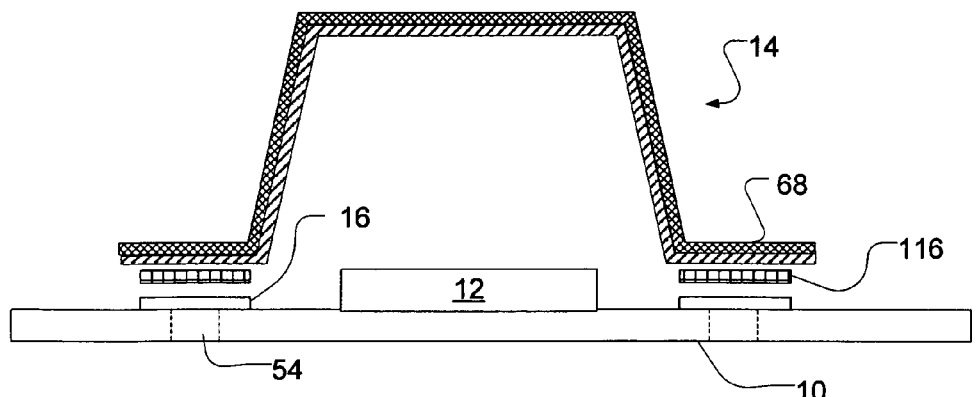
FIG. 11 is a simplified cross sectional, exploded view of an EMI shield being attached to a printed circuit board by an adhesive.

Referring now to FIG. 11, EMI shield 14 may be attached to a via 54 and/or surface ground trace 16 on the printed circuit board (PCB) 14 using a connector that is in the form of a pressure sensitive adhesive that is positioned on desired portions of the EMI shield 14. Adhesive 116 may be conductive or non-conductive. The adhesive 116 retains the desired location and position of the EMI shield 14 against surface ground trace 16 or the vias 54. In the illustrated configuration, the adhesive 116 is a "double sided" tape and attached to a lateral flange 68 that extends around a periphery of the EMI shield 14.

The adhesiveness of adhesive 116 may be chosen to have an adhesiveness that is sufficient to maintain the position of the EMI shield on the printed circuit board, yet allow for manual removal and replacement of the EMI shield back onto the printed circuit board. In other embodiments, adhesive 116 may have an adhesiveness that substantially permanently adheres the EMI shield on the ground trace 16.

In preferred embodiments, the double-sided adhesive 116 is intrinsically conductive so as to mechanically retain the location of the EMI shield 14 and also provide an electrical coupling to the ground trace 16 or vias 54 thereby improving the EMI shielding performance. As can be appreciated, the shape and size of the EMI shield may be formed in such a way that the flanges 68 around the perimeter, any internal walls of the EMI shield, and the shape of conductive adhesive 116 match the design of the exposed printed circuit board ground trace 16 for easy alignment and placement of the shield and improved grounding and shielding performance.

The double-sided adhesive may be in the form of pre-cut adhesive strips or the double-sided adhesive may be dispensed onto the ground trace or the EMI shield using a silk-screening or pad printing process. The double-sided adhesive 116 may be applied in a variety of different methods. For example, in one method, the double-sided adhesive may be applied to the flange (and other portions of the EMI shield) and thereafter the EMI shield may be robotically or manually placed onto the ground trace. Alternatively, the double-sided adhesive may be applied to the ground trace and thereafter the EMI shield may be robotically or manually placed onto the double-sided adhesive.

Figure 11A:
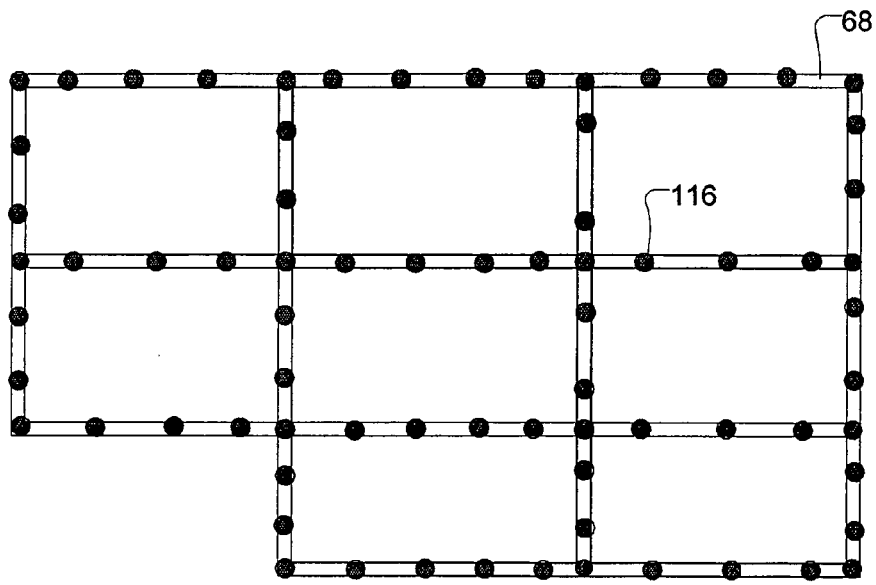
FIG. 11A illustrates an underside of an EMI shield that has a plurality of discrete adhesive spots on the flange and inner walls of the EMI shield.
Figure 11B:
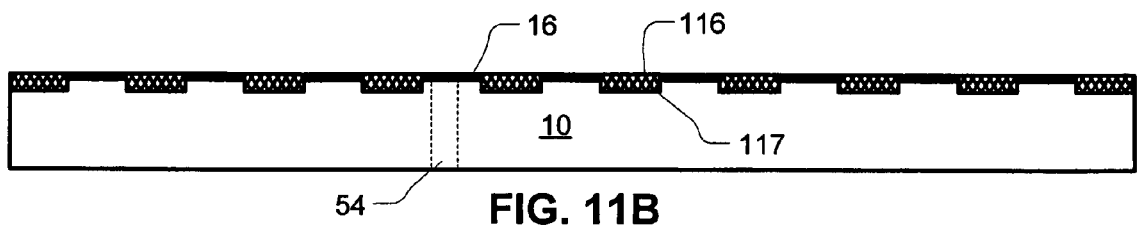
FIG. 11B is a sectional view of a printed circuit board having grooves for receiving an adhesive.
Figure 11C:
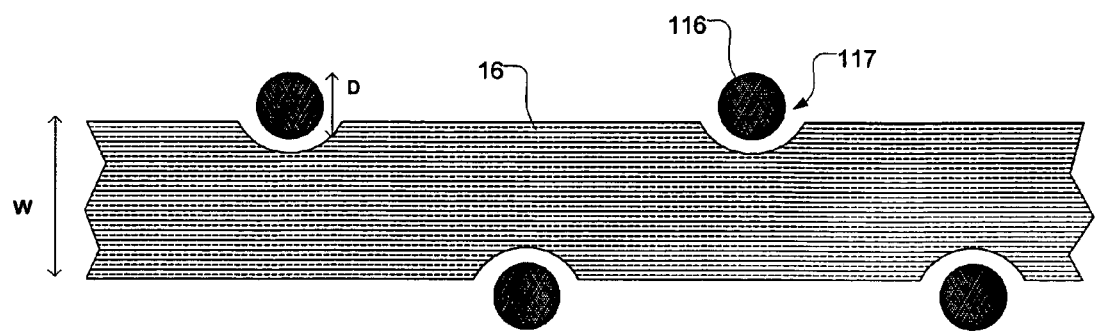
FIG. 11C is a top view of a ground trace and a plurality of discrete adhesives.

Referring now to FIGS. 11A to 11C, the adhesive 116 maybe positioned in a variety of different positions to couple the EMI shield 14 to a ground trace 16 or the vias 54 on the first external surface 50 of printed circuit board 10. For example, in FIG. 11A, the adhesive takes the form of discrete deposits of adhesive 116 that may be placed on an underside of the flange 68 of the EMI shield 14 in any desired spaced configuration using any desired method. The adhesives may be dispensed, either manually of robotically, through a syringe in either a continuous bead or in droplets at desired locations and frequency. Alternatively, the adhesive can be silk-screened onto the flanges of the shield.

If the adhesive is placed as droplets as is shown in FIG. 6 and 11A, the spacing between the adhesive droplets may vary depending on the applications, shield designs and operating frequency of the electronic device. Typically, an adhesive spacing corresponds to the spacing of the vias. The adhesive spacing also provides adequate mechanical connection between the shield and the printed circuit board using a minimal amount of adhesive, while still providing a sufficient electrical connection. If the adhesive is spaced too far apart, more offending EMI noise may leak out from under the EMI shield especially at the higher frequencies. Higher frequencies have smaller wavelengths that can leak out of smaller openings. Therefore, for higher frequencies, the adhesive droplets are placed closer together.

While not shown, in some embodiments dimples are formed in the flange 68 of the shield 14 in order to act like a recess or reservoir for any excess adhesive to flow into and collect. A flat flange may inadvertently force the adhesive away from the shield and spread the adhesive into other components. With conductive adhesive, this could cause short circuits on the printed circuit board. Therefore, the spacing of the droplets and dimples, and the design of the flange needs to be taken into consideration for each individual design.

Alternatively, as shown in FIG. 11B, the printed circuit board 10 may be etched, drilled or machined into the printed circuit board. The grooves may be created with a thick solder mask to create a plurality of discrete grooves 117 in the printed circuit board 10. Grooves 117 are sized and shaped to receive a sufficient amount of adhesive 116 so as to be able to reliably couple the metal layer 62 on flange 68 of the EMI shield 14 to the ground trace 16. For smaller printed circuit boards, a 1 mm-2 mm wide groove is generally sufficient. The depth of the grooves cannot be very deep since the printed circuit board is usually only between 1 and 2 mm thick. The depth of the grooves should be as deep as possible to provide a "well" for the adhesive to flow into, retain its location, and direct any adhesive flow. In exemplary embodiments, the depth of these grooves is between about 0.25 mm and about 0.5 mm, but it can be larger or smaller, depending on the dimensions of the printed circuit board. Filling the grooves with adhesive 116 may be accomplished through the use of manual or robotic syringe dispensing, or by selectively screening the adhesive onto the printed circuit board prior to the application of the EMI Shield.

The grooves 117 may be positioned adjacent (and non-overlapping) with the ground trace. Alternatively, to reduce the footprint of the EMI shield 14, the grooves 117 may be positioned so as to partially "overlap" with at least a portion of the ground trace 16 or vias 54. For example, as shown in FIG. 11C, the grooves 117 may be circular and positioned so that the diameter D of the groove 117 substantially overlaps with a width W. As can be appreciated, the shape of the groove 117 and the size of the adhesive deposit may be any shape and may overlap the ground trace 16 any desired amount. In the illustrated embodiment, the adhesive is non-conductive, so that the adhesive 116 makes only a mechanical connection to the flange 68. Such a mechanical connection creates a mechanical and electrical contact between flange 68 and the ground trace 16.

While not shown, grooves 117 may be positioned directly over a via 54 so that the adhesive droplet may be applied directly onto the via to couple the EMI shield to the via. In such embodiments, the ground trace 16 may or may not be present.

Figure 12:
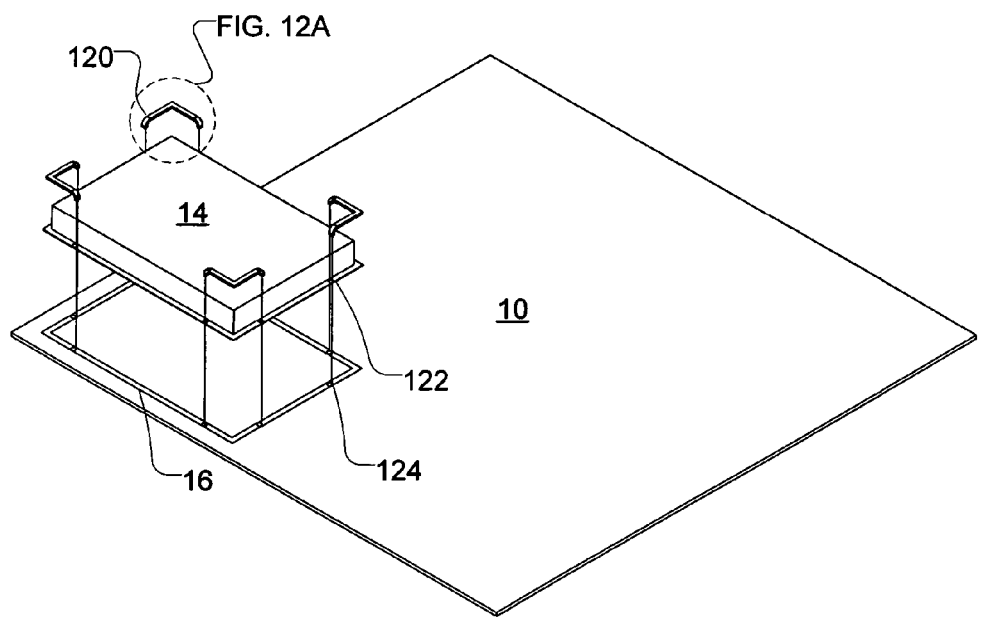
FIG. 12 is an exploded perspective view of an EMI shield located and retained in place on ground trace on a printed circuit board through the use of a plurality of mechanical connectors.
Figure 12A:
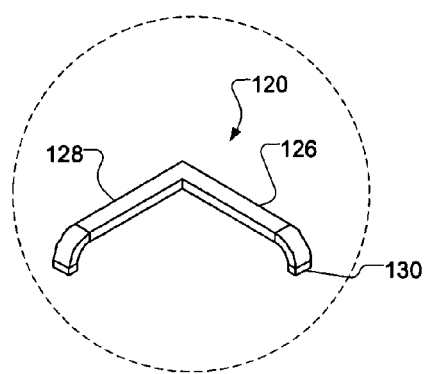
FIG. 12A illustrates one embodiment of a mechanical connector of FIG. 12 that is encompassed by the present invention.

Referring now to FIGS. 12 and 12A, alternatively or in addition to the adhesive 116, one or more mechanical connectors 120 may be used to facilitate grounding and attachment of an EMI shield 14 to ground trace 16 or vias 54 of printed circuit board 10. The mechanical connectors may be made of a non-conductive material (e.g., plastic) or a conductive material (e.g., metal).

If ground trace 16 is not present and mechanical connector 120 is to interact with vias 54, if vias 54 were large enough to accommodate the mechanical connector 120, the mechanical connector 120 could be inserted directly into vias 54. If conductive mechanical connectors 120 are used, they could provide an electrical connection in addition to the mechanical connection by being inserted into conductively plated via 54. If non conductive mechanical connectors 120 are used and the connectors were simply used for a mechanical connection to retain the shields location, then the interface between the metallized flange of the EMI shield 14 and the exposed conductive areas of the vias would provide the necessary shielding effectiveness. The nubs or dimple features described earlier could also be incorporated to enhance additional grounding locations.

These mechanical connectors 120 may pass through various apertures 122 in the EMI shield 14 and into the printed circuit board 10 so as to encourage a physical and electrical connection between an inner metal layer of EMI shield 14 and the ground trace 16 and/or vias 54. These mechanical connectors 120 may resemble screws, pins, staples, rivets, brackets or a plurality of other similar mechanical devices made from metal, plastic or other materials. The connectors 120 could be designed to either permanently affix the EMI shield to the printed circuit board or be designed for repeated removal and insertion of the EMI shield. The latter design feature may be desirable so that the EMI shield 14 could be repeatedly applied and removed in order to access the electronic components on the printed circuit board that are enclosed by the EMI shield without the use of a special tool. As can be appreciated, electronic components on the printed circuit board may need to be serviced or repaired from time to time and therefore a repeatable and nondestructive method of attaching and removing the EMI shield 14 is desirable. The mechanical connectors 120 may manually or robotically be inserted through the apertures 122 in the shield and apertures 124 in the printed circuit board. Additional steps may be made to ensure the retention of the connectors and the electrical grounding connection between the EMI shield and the printed circuit board. These additional steps may include but should not be limited to soldering, ultrasonic welding, sintering, laser melting or the like.

FIG. 12A illustrates one exemplary mechanical connectors120 that is encompassed by the present invention. Connector 120 includes a first arm 126 coupled to a second arm 128. Arms 126 and 128 are substantially perpendicular to each other. Each arm 126, 128 comprises a finger or curved protrusion 130 whose end is sized and shaped for insertion through the apertures 122, 124. In use, the mechanical connectors are aligned with apertures 122, 124 and the protrusions 130 are inserted into the apertures until the EMI shield 14 is firmly positioned against the ground trace 16. It should be noted that the connector 120 shown in FIGS. 12 and 12A are configured for insertion into a corner of a substantially rectangular EMI shield 14. As can be appreciated the mechanical connectors may be shaped to be inserted onto other portions of the EMI shield and positioned at other strategic locations.

Some preferred methods of coupling the connector 120 with the apertures 122 is through a press-fit (mechanical interference), a tension fit, or a tension snap fit. For the tension fit applications, the curved protrusions 130 extend through the aperture 122 in the EMI shield and corresponding aperture 124 in the printed circuit board. The protrusions 130 may be adapted to flex inward so as to be equal to or smaller than the diameter of the connector or corresponding aperture in the printed circuit board. Once through the thickness of the printed circuit board 10, the protrusions 130 could curve back outward and not allow the connector protrusions 130 to pass back through the printed circuit board aperture 124 without having the protrusions be flexed back inward.

Figure 13:
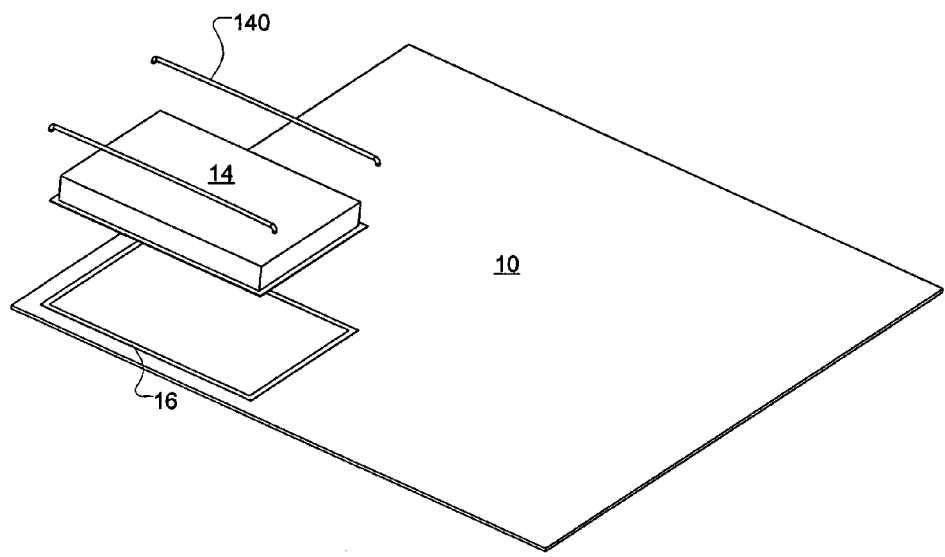
FIG. 13 is an exploded perspective view of an EMI shield that is located and retained in place on a printed circuit board through the use of a plurality of curved, flexible connectors.
Figure 14:
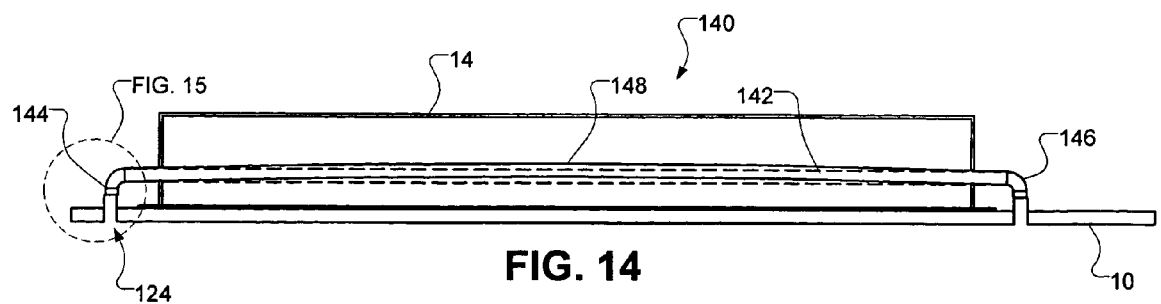
FIG. 14 illustrates a method of attaching the curved, flexible connector to the EMI shield and printed circuit board.
Figure 15:
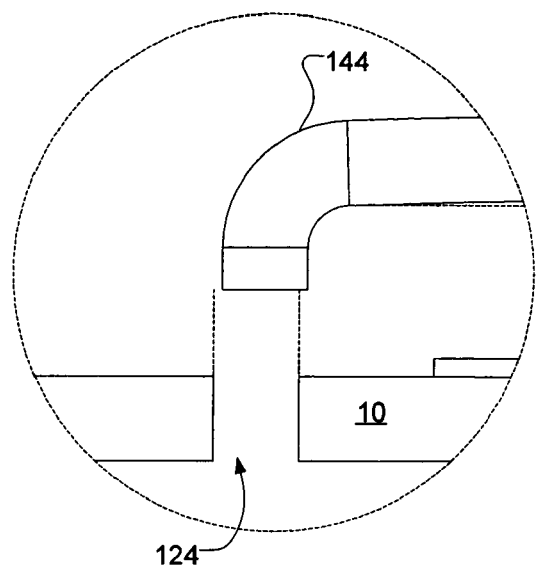
FIG. 15 is a close-up of an end of the curved, flexible connector of FIGS. 13 and 14 and its interaction with an aperture in the printed circuit board.

FIGS. 13 to 15 illustrate another embodiment of the mechanical connectors that are encompassed by the present invention. In the illustrated embodiment, one or more curved connectors 140 are used to couple the EMI shield 14 to the ground trace 16 and/or vias 54. As shown in FIG. 14, the curved, flexible connectors 140 comprise an elongate body 142 that has a slight upward curvature away from a surface of the printed circuit board. The ends 144, 146 of the elongate body are sized and shaped to fit within apertures 124 within the printed circuit board 10. The curved flexible connectors 140 may be made out of aluminum, steel, copper, and the like. Alternatively, the curved flexible connectors may be composed of injection molded plastic or extruded plastic. The plastic materials may be a nylon, polypropylene, ABS, polystyrene, PET or similar polymers.

Due to the curvature of the connectors 140, the ends 144, 146 of the connectors curve downward (perpendicular to a top surface of printed circuit board 10) and do not quite line up with the holes 124 in the printed circuit board (see FIGS. 14 and 15). In order to align the ends 144, 146 of the curved bracket with the holes 124 in the printed circuit board, the ends of the flexible connector 40 must be forced outward by pressing downward on or near a center 148 of the connector so as to straighten out the entire connector (as shown by the dotted lines in FIG. 15).

As shown in FIG. 15, once connector 40 substantially straightens out, the ends 144, 146 will align with apertures 124 and the natural spring force as a result of the curvature of the connector 140 will create tension and friction between the ends 144, 146 of the connector and the holes 124 of the printed circuit board. The tension and friction may keep the flexible connector 140 straight and may maintain pressure across the entire flange 68 of the EMI shield 14 and also secure the connector 140 in place. In order to remove the connector and to remove the EMI shield 14 from the printed circuit board, the user merely needs to apply an upward force (e.g., pull up) on the connector 140 and move the connector back to its curved configuration, which will release the tension and friction between the ends 144, 146 and the holes 124.

Figure 16:
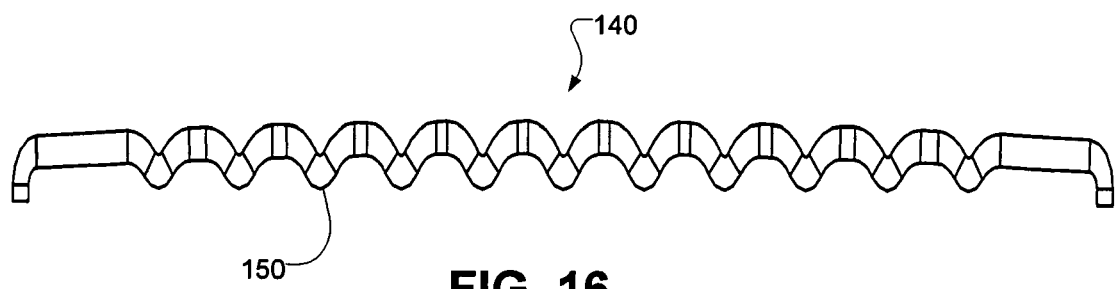
FIG. 16 illustrate an alternative embodiment of a connector that comprises a plurality of contact points along its body.

FIG. 16 illustrates another embodiment of a connector 140 of the present invention. Similar to the embodiments of FIGS. 13-15, the connector 140 shown in FIG. 16 will have a slight curvature, so that upon insertion of ends 144, 146 into holes 124 in the printed circuit board, a friction force and tension force will maintain the EMI shield 114 on the ground trace 16. Additionally, the flexible connector 140 in FIG. 16 has a plurality of contact points 150 over the length of the elongate body. Thus, when flexible connector 140 is straightened, the contact points 150 will contact the flange 68 and apply a substantially even pressure downward into the printed circuit board over the length of flange 68 of the EMI shield. The contact points 150 may be added to the elongate body, or the elongate body may be shaped to have the contact points. For example, the curved connector 140 may be in a serpentine shape and the bottom apices will act as the contact points 150.

Figure 17:
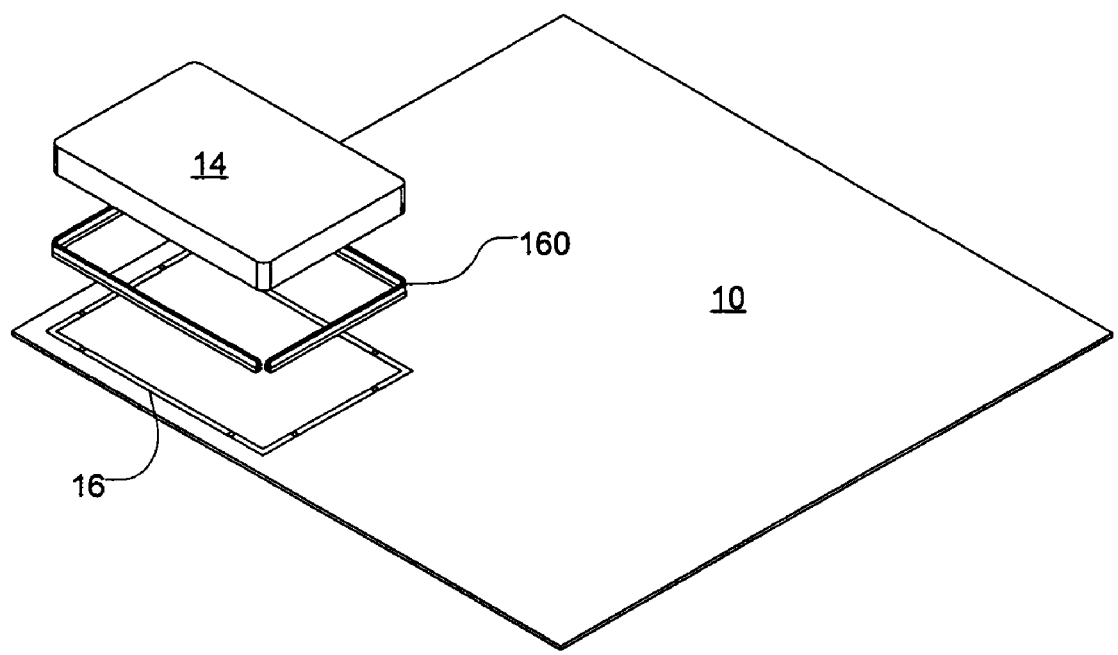
FIG. 17 is an exploded perspective view of mechanical clips that are attached to the printed circuit board which removably couple an EMI shield to a ground trace on the printed circuit board.
Figure 18:
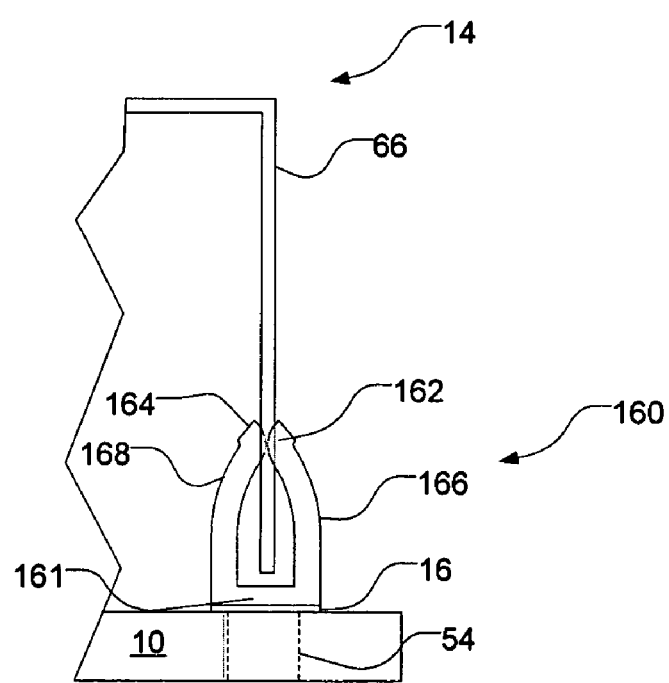
FIG. 18 is a partial side elevational view of a clip of FIG. 17 that couples the EMI shield to the ground trace.

Referring now to FIGS. 17 and 18, the connector of the present invention may have a plurality of clip members 160 that are attached to the ground trace 16 or directly over at least some (typically all) of the vias 54, typically with an adhesive or solder (not shown). The clip member 160, may be made from metal and would be soldered onto a printed circuit board in a desired strategic location. The clip member 160 may be designed to receive the sidewalls 66 of an EMI shield 14 and would perform in a similar manner as a paper clip. Portions of the sidewall 66 of the EMI shield would effectively be "pinched" by features 162, 164 on opposing arms 166, 168 of the clip member to retain the EMI shield 14 on the ground trace 16 (or via 54) and also make an electrical grounding connection between the ground trace 16 or via 54, and the metallized sidewalls 66 of the EMI shield. Such a configuration allows the EMI shield 14 to be repeatedly installed and removed as needed for service or circuitry repair, without damaging the EMI shield or the printed circuit board. Optionally, the EMI shield could have recesses or apertures (not shown) that are configured to receive the features 162, 164 of the clip member.

Figure 19:
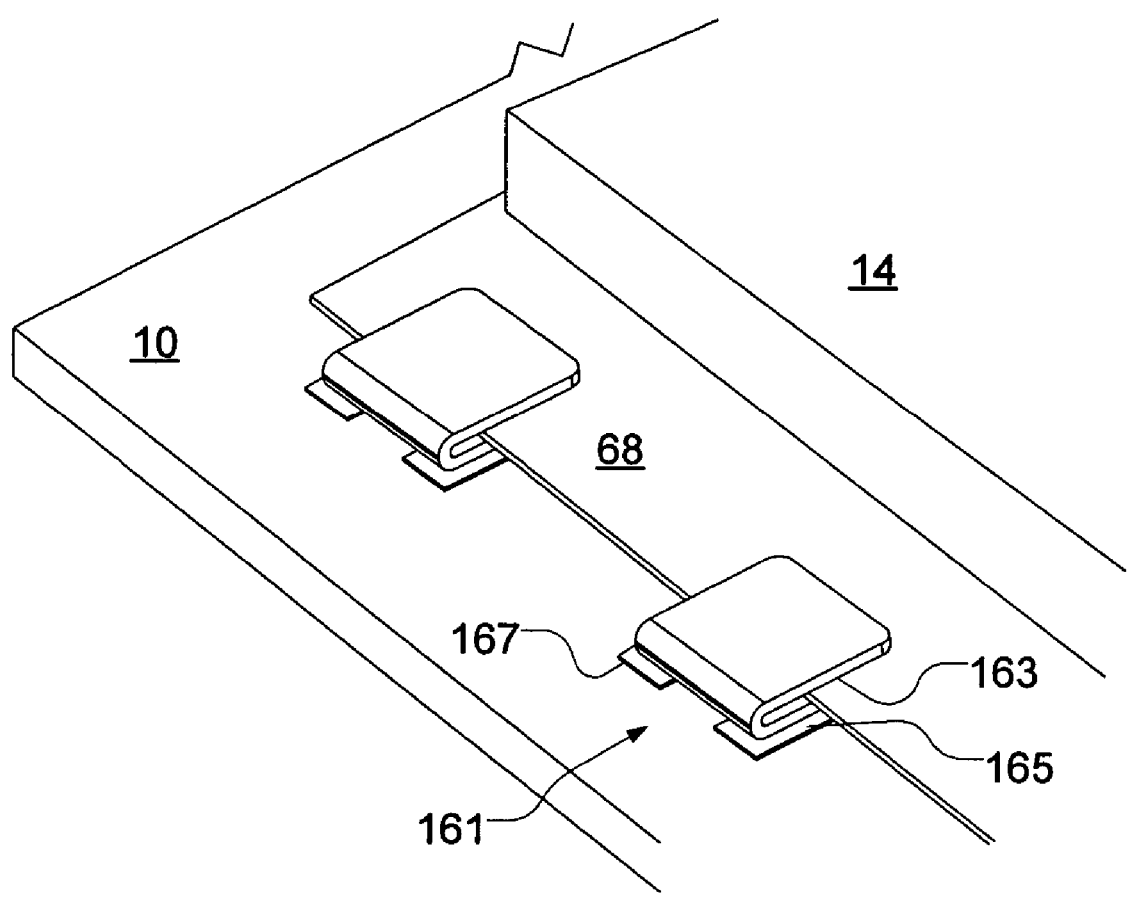
FIG. 19 illustrates another embodiment of the mechanical clips that removably couple the EMI shield to the ground trace.

FIG. 19 illustrates another embodiment of a mechanical connector 161 that is encompassed by the present invention. In this configuration, the mechanical connector 161 may be in the form of a clip that is positioned and configured to mechanically contact a flange 68 on the EMI shield 14. Clip 161 may be of various sizes and shapes and made from a variety of materials, but are usually conductive and comprised of a metal. As can be appreciated, it may be desirable to have clips 161 be formed of a metallized plastic. Clip 161 may comprise an essentially U or C-shaped body that comprises a first and second opposed arms 163, 165 for receiving a portion of the EMI shield 14. Clips 161 are usually directly attached to the ground trace 16 or vias 54, but the clips 161 may be positioned adjacent the ground trace so as to directly contact and ground the metal layer on flange 168 to the ground trace 16 or via 54.

Clips 161 may be used to press the electrically conductive surface of the EMI shield 14 against the exposed ground trace of the printed circuit board. If the connectors are conductive and are allowed to be electrically coupled to the ground plane of the printed circuit board, the clips improve shielding effectiveness by being able to more directly connect the second metallized layer on the outside surface of the EMI shield 14 (e.g., side not facing the printed circuit board) to the electrical ground of the printed circuit board. In the illustrated configuration, arm 163 of the conductive connector contacts the second, upper surface of the flange 168 of EMI shield 14 and the opposed arm 165 of the connector makes electrical contact to the ground trace (not shown). Such a configuration provides better grounding of the second metallized surface which would only normally be grounded to the printed circuit board through the continuity of the first metallized surface being electrically connected to the metallized second surface by the metallized edge of the EMI shield.

Clips 161 may be located onto the printed circuit board 10 either by hand placement or by robotic placement similar to other electronic components on the printed circuit board 10. In one embodiment, the clips 161 may be attached to the ground trace (or printed circuit board 10) through an adhesive (not shown). Alternatively, clips 161 may either be soldered by hand or sent through a common surface mount technology (SMT) line, similar to other electronic components on the printed circuit board. On a SMT line, the printed circuit board and the placed electronic components are sent through a reflow oven where the components are soldered into place. As is known in the art, components are placed onto the printed circuit board 10 and onto solder paste to hold the components in place. The solder paste contains solder 167 and flux. Once the solder 167 and component are passed through the reflow oven, the flux evaporates, the solder melts and then the printed circuit board exits the oven where the solder solidifies and creates a mechanical/electrical bond to the printed circuit board 10.

Once the clips are soldered into place, the metallized thermoform EMI shield 14 may be slipped into the clips where the flange 168 of the EMI shield is 10 pinched between the arms 163, 165 to hold the EMI shield 14 in place and make an electrical contact to ground through the clip 161. As can be appreciated, with such a configuration, the EMI shield is removably attached to the ground trace via the clips, and the EMI shield 14 may easily be attached and removed as need so as to access the electrical circuits and components that are positioned within EMI shield 14.

The connectors illustrated in FIGS. 11 to 19 allow for connection and removal of the EMI shield 14 from the printed circuit board 10, independent of the position of the outer enclosure of the electronic device. Thus, the outer enclosure of the electronic device may be removed/detached from the printed circuit board without effecting the shielding provided by the EMI shield.

Figure 20:
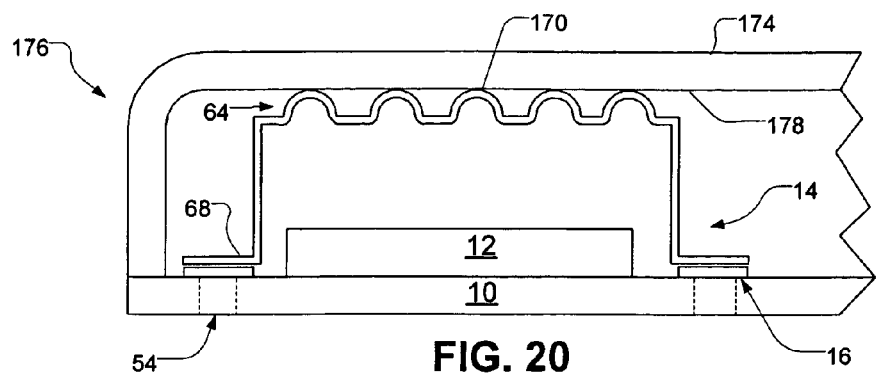
FIGS. 20 and 21 illustrate an EMI shield that is held in place on a printed circuit board through the interaction between features on the EMI shield and an inner surface of an outer housing of the electronic device.
Figure 21:
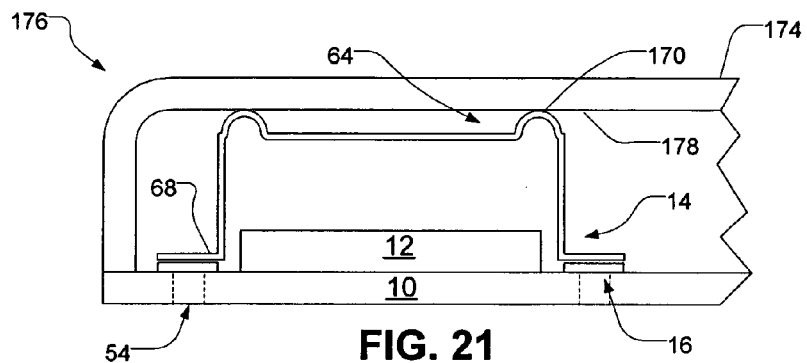

FIGS. 20 and 21 illustrate two additional embodiments for grounding and retaining an EMI shield 14 to a printed circuit board 10. Such embodiments utilize various design features 170 that can be incorporated into a top surface 64 of the EMI shield during the forming process. The shape and location of the design features 170 is often dependant on design of the printed circuit board and the design of the outer enclosure 174 of the electronic device 176. The design features 170 often have details that are convex and protruding towards an inside surface 178 of the enclosure 174 of the electronic device 176 and away from the printed circuit board 10. The features 170 cause the EMI shield 14 to be dimensionally taller than the available space allowed between the inside of the enclosure and the surface of the printed circuit board. As a result, when the enclosure is closed, the inside surface 178 of the enclosure presses down on the convex features 170 of the EMI shield 14 and compresses the shield against the ground trace 16 and/or vias 54 of the printed circuit board 10, thereby retaining its position and location against the printed circuit board. The added compressive force also improves the electrical contact pressure between the conductive surfaces (e.g., flange 68) of the EMI shield 14 and any exposed grounding trace 16 or via 54 on the printed circuit board surface thereby improving the grounding connection and shielding performance of the shield.

The top surface 64 may have features 170 only along selected portions (e.g., adjacent and above vertical sidewall 66 so as to apply more pressure down sidewall 66 and improve the contract pressure between the flange 68 and ground trace 16 or grounding via 54) (FIG. 21) or the features may be spaced evenly over substantially the entire top surface 64 (FIG. 20). If desired, an adhesive may be applied to the flange 68 so as to position the EMI shield 14 on the ground trace 16 or via 54.

Figure 22:
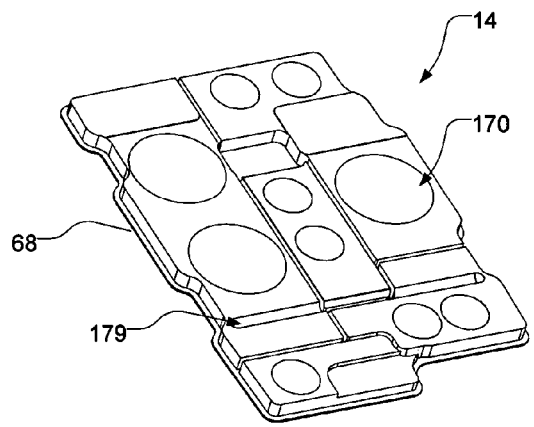
FIG. 22 illustrates a multi-compartment EMI shield having cavities for receiving ribs of an outer housing and semicircular features along a top surface of the EMI shield that improves compression force of the EMI shield on the printed circuit board

FIG. 22 illustrates a multi-compartment EMI shield 14 that comprises structural details 170 along an outer, top surface 64 that improve the compressive forces caused by the interaction between the EMI shield 14 and an outer housing of the electronic device (e.g., cellular phone). In the illustrated configuration, structural details 170 are in the form of a semicircular feature. Structural details 170 may also include cavities 179 that are configured to receive a rib that is attached to the outer housing of the electronic device (See FIG. 27). As can be appreciated, when the outer housing is placed over EMI shield 14, the ribs extend into the cavities 179 such that semicircular feature 170 is in contact with an inner surface of the outer housing. When the outer housing is placed around the printed circuit board (not shown), the ribs and semicircular features 170 act to compress the flange 68 of EMI shield 14 against the ground trace on the printed circuit board. As can be appreciated, in some embodiments, the semi circular features 170 are sufficient to compress the EMI shield 14 against the printed circuit board, and the ribs will not be necessary.

Figure 23:
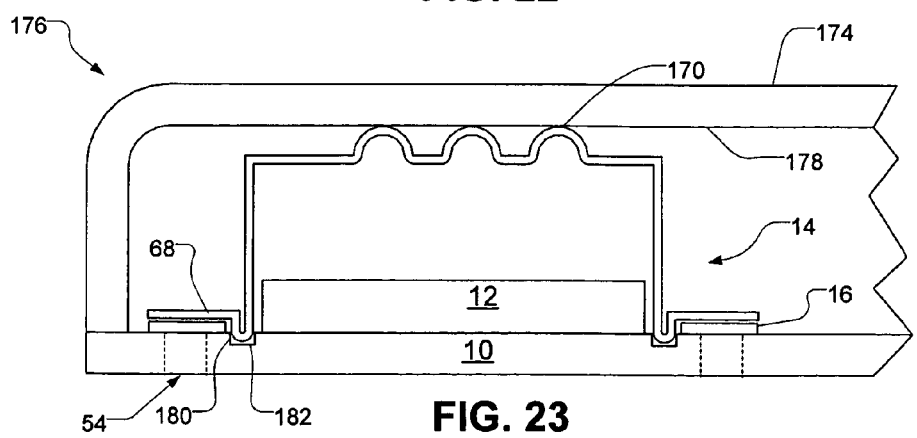
FIG. 23 illustrates male features in an EMI shield that interact with a corresponding female feature (e.g., groove) on the printed circuit board to retain and locate the EMI shield on the printed circuit board.

As shown in FIG. 23, similar to other embodiments of the present invention, the present invention may also involve incorporating male features 180 into EMI shield that contact corresponding female features 182 on the printed circuit board 10 to encourage EMI shield 14 location and retention with the printed circuit board 10 in the electronic device 176.

The feature 180 may be in the form of a bump, boss, protrusions, and the like, and are typically formed integrally with flange 68 on the shield during the forming process (e.g., thermoforming process). In the illustrated embodiment, feature 180 is in the form of an additional bend in the polymer material that creates a protruding ridge that extends around the entire perimeter of the EMI shield 14. As can be appreciated, instead of a continuous protrusion, the EMI shield may include one or more discrete features, and the features 180 may be positioned along the entire flange 68 or the features 180 may be strategically placed over only select portions of the flange 68. The corresponding female feature 182 will generally be positioned in a position that corresponds to the male features. The female features may be a groove, trough, a hole, slots and the like. The female feature 182 may be created by a router or similar mechanical device during the printed circuit board manufacturing process.

In use, the female feature 182 in the printed circuit board may be used as a receptacle and receive the male features 180 of EMI shield and will help position the EMI shield on the printed circuit board. Optionally, features 180 may be used to lock the EMI shield in the grooves. If desired, the female feature 182 may comprise an undercut or dovetail shape so as to pinch the features 180 and improve the ability to retain the EMI shield in place.

Optionally, flange 68 may include an adhesive (not shown) (e.g., conductive, double sided adhesive 116 so as to attach the EMI shield to ground trace 16 or via 54. Additionally or alternatively, EMI shield 14 may include features 170 along the top surface 64 that are used to interact with the outer enclosure 174 to push the EMI shield against the ground trace 16, as described above in relation to FIGS. 20 to 22. In yet other embodiments, other connectors of the present invention, such as a clip, or the like, may be used to maintain the position of the EMI shield against the ground trace 16 or via 54.

Figure 24:
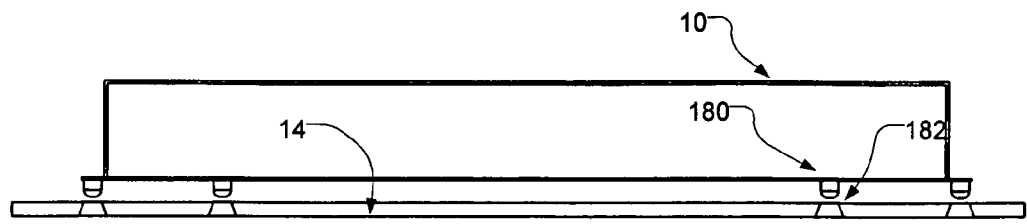
FIG. 24 illustrate one particular tongue and groove embodiment that attaches the EMI shield to the printed circuit board.
Figure 25:
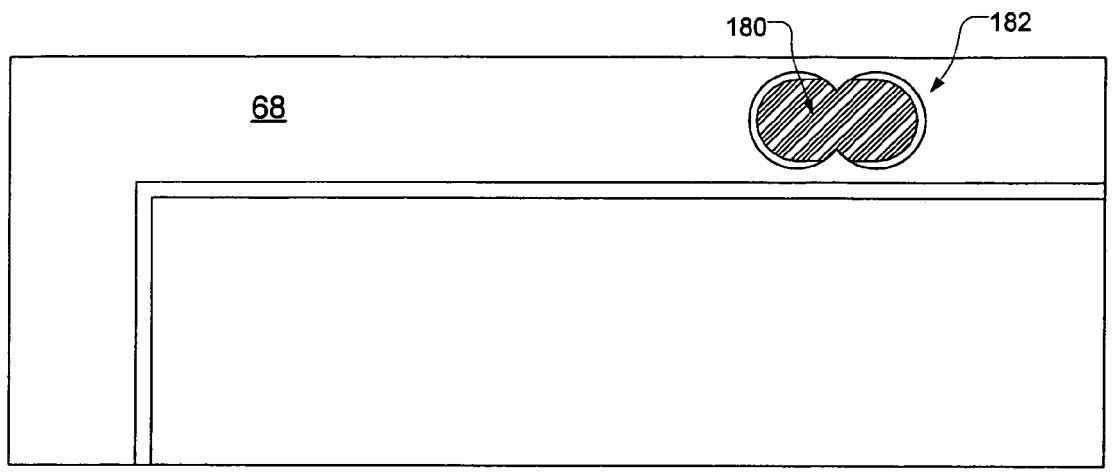
FIG. 25 is a bottom view of a tongue feature being pinched by a groove in the printed circuit board.

Another embodiment, which is similar to the embodiments of FIGS. 9 and 10, comprises features on the flange 68 and is shown in FIGS. 24 and 25 where the male and female features 180, 182 resemble a tongue and groove. The groove 182 is in the form of a trough that is fabricated into the surface of the printed circuit board 10. The flange 68 of EMI shield 14 may be integrally formed with one or more protruding "tongues" or boss features 180 that are designed to mate with the groove 182 fabricated in the printed circuit board 10. Utilizing the inherent flexibility and compressibility of the plastic material the shield is made from (polymer), the tongue feature 180 may naturally deform to match the contour and shape of the groove 182. Thus if the shape and size of the grooves 182 are designed to be smaller than the features 180, the deformation of the features should result in sufficient frictional contact between the feature of the shield and the corresponding feature of the printed circuit board to retain the location and position of the shield. Although the tongue and groove example is a specific design feature, it should be appreciated that other design features, common to someone skilled in the art, could be incorporated into the design of the printed circuit board, the shield or both in effort to achieve the same positioning and retention result.

Moreover, instead of having the male features on the EMI shield, the EMI shield may be manufactured to have female features and the male features may be added onto the printed circuit board. In such embodiments, the grooves in the printed circuit board to be similar to plated through holes in a printed circuit board where screws pass through and both secure and ground the printed circuit board. These plated holes are thru holes that are electrically coated with the same ground trace material and are electrically connected to the ground plane of the printed circuit board. For our grooves, the grooves could go through a particular depth of the printed circuit board or pass all the way through the printed circuit board in periodic locations in order to provide enough of an aperture to allow the tongue of our shield to make electrical contact with the plated surface of the groove. The details would be small, but we are capable of forming small details into our shields as well.

Figure 26:
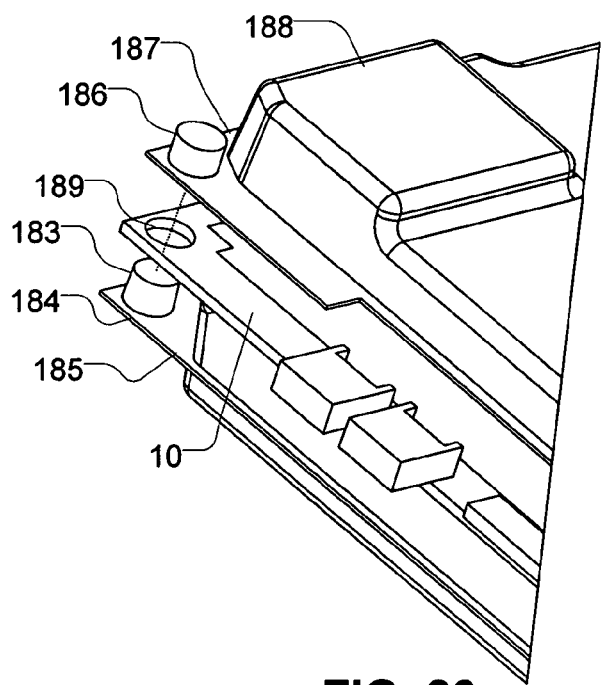
FIG. 26 is a partial view of a first EMI shield and a second EMI shield coupled to opposite sides of the printed circuit board with mating female and male connectors.

FIG. 26 illustrates yet another embodiment encompassed by the present invention. In this configuration, a printed circuit board 10 will be sandwiched between either a 2-piece or a living hinge clam shell shield. In the illustrated embodiment, a male snap feature 183 or boss may be integrally formed or attached to a a flange 184 of first shield 185 and a female snap feature 186 will be integrally formed or attached to a flange 187 of a second shield 188. The male snap feature may be pressed upward, through an aperture 189 in the printed circuit board 10 and will protrude past through to the other side of the printed circuit board 10. The protrusion of the male snap feature 183 will simultaneously engage with the female snap feature 186 as the other half of the shield is brought downward against the printed circuit board 10.

The male and female snap features 183 may mechanically hold the 2 shield halves 185, 188 together through a mechanical interference fit. The severity of the interference fit can be varied through the design of the snap feature. If more or less interference is desired, the diameter of the male (or female) snap features can be increased or decreased accordingly.

As can be appreciated, in alternative embodiments, the two-part shield may be sized and shaped so that the EMI shield extends beyond the edge of the printed circuit board so that the male and female snap features 183, 186 are configured to snap together outside the perimeter of the printed circuit board so as to effectively sandwich the printed circuit board between the two shield halves.

In yet other embodiments, both the first shield 185 and second shield 188 may have male snap features (not shown) that are configured to allign with different apertures in the printed circuit board. Alternatively, both the first shield 185 and second shield 188 may have female snap features that align with different male protrosions or standoffs that extend from a surface of the printed circuit board.

Optionally, the inner diameter of the aperture 189 in the printed circuit board may be plated or otherwise made conductive and connected to a ground plane on the printed circuit board. In such embodiments the male snap feature may also provide an electrical connection to the ground plane of the printed circuit board which is desirable for effective EMI shielding. Morover, the snapping of the first shield 185 and the second shield 188 may bring a portion of the shields in contact with a surface ground trace ov vias (not shown).

While the illustrate embodiment illustrates only a single pair of male and female snap features 183, 186, as can be appreciated, the shields may incorporate as many snap features as desired. For example, the snap features may only be positioned at the corners of the printed circuit board. Alternatively, the snap features may be disposed along selected portions of the perimeter (or anywhere along the surface of the printed circuit board).

Figure 27:
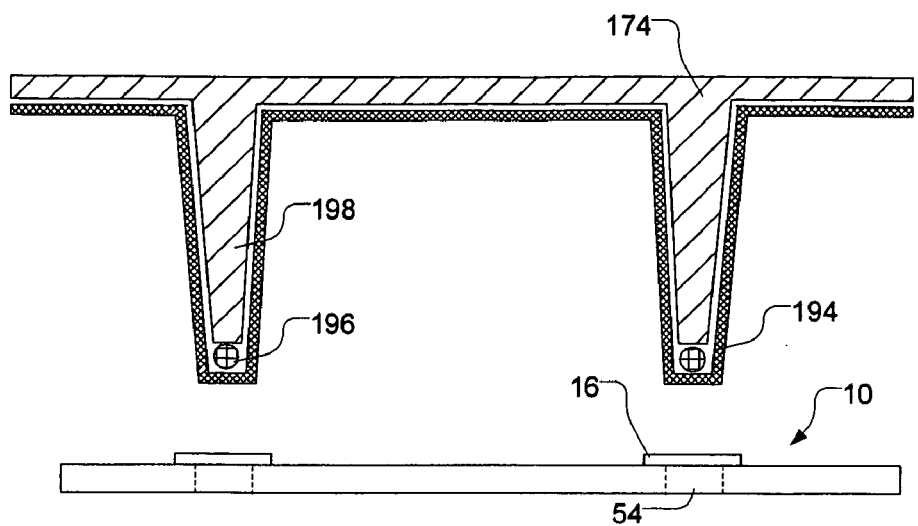
FIG. 27 illustrates a gasket positioned between an EMI shield and ribs of an outer housing.

Referring now to FIG. 27, in embodiments of the EMI shield 14 which have cavities to receive a rib 198 from the outer enclosure 174 of the electronic device, a gasket 196 may be placed in cavity 194 in between the rib 198 and the EMI shield 14. The gasket 196 increases the contact pressure that the EMI shield 14 makes with the ground trace 16 or vias 54 on the printed circuit board 10. As can be appreciated, a higher contact pressure impress the electrical connection. A more complete description of suitable gaskets and other EMI shield may be found in commonly owned U.S. patent application Ser. No. 09/685,969, field Oct. 10, 2000 (now abandoned), the complete disclosure of which is incorporated herein by reference.

Figure 28:
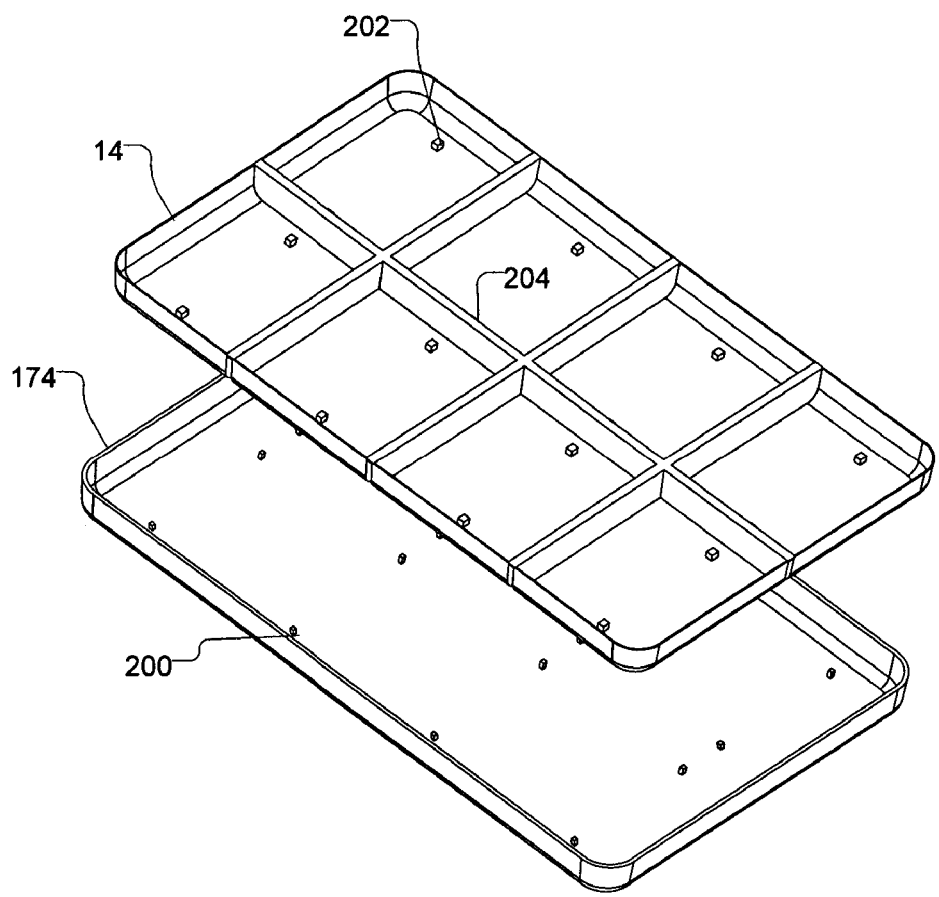
FIG. 28 illustrates an outer housing that comprises male locators that interact with female locators on the EMI shield.

FIG. 28 illustrates an embodiment in which outer enclosure 174 includes locators 200. Locators 200 are configured to interact with portions 202 of the EMI shield so that the relative position between the outer enclosure 174 and EMI shield 14 is maintained. The locators 200 may be protrusions, recesses, or other features that mate with a corresponding portion 202 of EMI shield. In the illustrated embodiment, the EMI shield comprises optional support ribs 204 that may provide structure support to EMI shield 14. Alternatively, support ribs 204 may correspond to the cavity 194 that is shown in FIG. 25, so as to receive ribs (not shown) from the outer enclosure 174.

Locators 200 and portions 202 may have a friction or interference fit to hold the EMI shield 14 in place relative to the enclosure 174. Such an interaction allows for easy removal of the EMI shield and thus improves the recyclability of the end use product. Alternatively, droplets of adhesives could be placed in the shield locators 202 prior to attaching the EMI shield 14 to the enclosure 174. In such embodiments, the locators 200 would not require a friction fit as the adhesive would hold the shield in place. As can be appreciated, locators 200 may be used with any of the other embodiments that are encompassed by the present invention.

Figure 29:
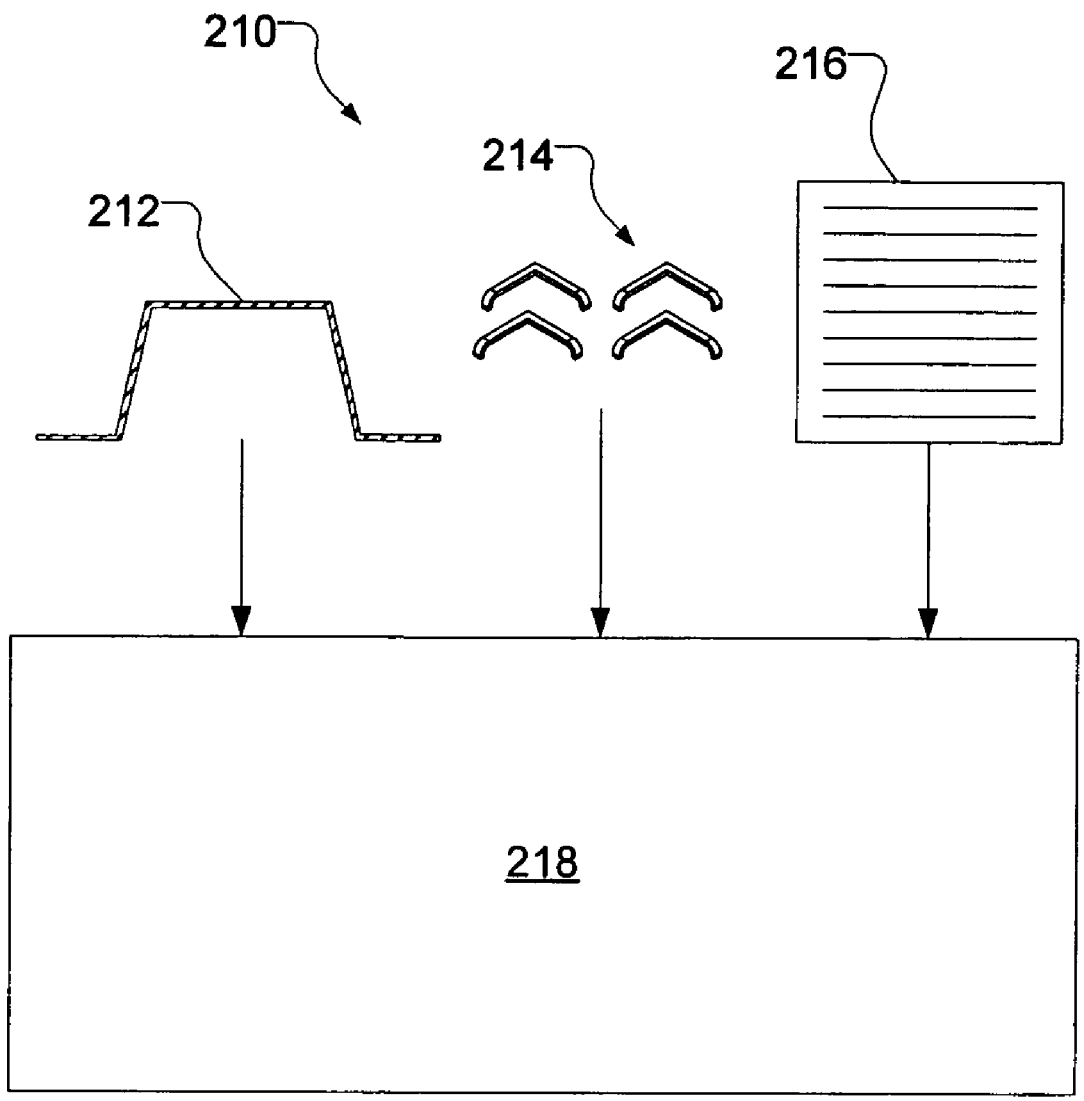
FIG. 29 illustrates a kit encompassed by the present invention.

FIG. 29 illustrates a kit that is encompassed by the present invention. Kit 210 includes an EMI shield 212 and one or more connector(s) 214. EMI shield 212 may be any of the EMI shield described herein or it may be any conventional EMI shield known in the art. The EMI shield 212 will be configured to be usable with connector(s) so as to allow attachment to a printed circuit board. Connector(s) 214 may be any of the connector's described herein. Connectors 214 may be integrally formed in the EMI shield, removably attachable to the EMI shield, and/or fixedly attachable to the ground trace on the printed circuit board.

Kit 210 may also include instructions for use 216 which recite any of the methods described herein. Instructions for use, EMI shield 212 and connector(s) 214 may be held in packaging 218. Packaging 218 may be any conventional packaging, including pouches, trays, boxes, tubes, or the like. The instructions for use 216 will usually be printed on a separate piece of paper, but may also be printed in whole or in part on a portion of the packaging 218.

While particular forms of the invention have been illustrated and described, it will be apparent that various modifications can be made without departing from the spirit and scope of the invention.

What is claimed is:

1. A shielded printed circuit board (PCB) comprising:
a PCB comprising a first surface and a second surface;
a metallized polymer shield coupled to the first surface of the PCB;
a grounded layer coupled to the second surface of the PCB;
a plurality of conductive vias that extend from the first surface to the grounded layer so as to electrically couple the metallized polymer shield to the grounded layer;
an electronic component mounted to the first surface of the PCB;
wherein adjacent conductive vias are spaced within the PCB a distance that is small enough to reduce a passage of electromagnetic radiation from the electronic component through the spacing between the adjacent conductive vias;
wherein the metallized polymer shield comprises a shaped polymer substrate that provides a cavity that is sized and shaped to receive the electronic component, wherein the shaped polymer substrate comprises a flange that extends around at least a portion of a perimeter of the cavity in a direction that is substantially parallel to the first surface of the PCB; and
a metal layer disposed over at least one surface of the shaped polymer substrate.

2. The shielded PCB of claim 1 wherein the plurality of conductive vias, grounded layer, and metallized polymer shield forms a three dimensional grounded EMI shield that substantially envelopes the electronic component.

3. The shielded PCB of claim 1 wherein the metallized polymer shield is removably coupled to the first surface of the PCB.

4. The shielded PCB of claim 3 wherein the metallized polymer shield is coupled to the vias through a conductive element.

5. The shielded PCB of claim 4 wherein the conductive element comprises a conductive adhesive.

6. The shielded PCB of claim 3 wherein the metallized polymer shield is coupled to the vias through a mechanical connector.

7. The shielded PCB of claim 1 wherein the PCB comprises two or more layers, wherein the second surface is between two adjacent layers of the PCB.

8. The shielded PCB of claim 1 wherein the second surface is an external, bottom surface of the PCB.

9. The shielded PCB of claim 1 wherein the grounded layer comprises a ground plane.

10. The shielded PCB of claim 1 wherein the grounded layer is electrically coupled to a ground plane.

11. The shielded PCB of claim 1 wherein the flange of the metallized polymer shield comprises a plurality of openings.

12. An electronic device comprising the PCB of claim 1.

13. The shielded PCB of claim 1 wherein at least one of said conductive vias is located below said PCB.

14. A printed circuit board comprising:
a multi-layered substrate that comprises a first external surface and a second external surface, wherein a portion of the first external surface is configured to receive an electronic component;
one or more internal grounded layers disposed between adjacent layers of the multi-layered substrate;
a network of conductive elements that extend through at least a portion of the multi-layered substrate, wherein the electrically conductive elements extend from at least one of the internal grounded planes to the first external surface;

a shield coupled to the first surface, the shield electrically coupled to at least some of the conductive elements to provide an electrical grounding connection between the shield and the one or more internal grounded planes;

wherein spaces between adjacent conductive elements comprise a largest dimension that is small enough to substantially reduce emission of electromagnetic radiation from the electronic component;

wherein the shield comprises a shaped polymer substrate that provides a cavity that is sized and shaped to receive an electronic component, wherein the shaped polymer substrate comprises a flange that extends around at least a portion of a perimeter of the cavity in a direction that is substantially parallel to the first external surface of the PCB; and a metal layer disposed over at least one surface of the shaped polymer substrate.

15. The printed circuit board of claim 14 wherein the network of conductive elements comprises a plurality of conductively coated or filled vias.

16. The printed circuit board of claim 14 further comprising a grounding trace on the first external surface that substantially surrounds the portion of the first external surface that is configured to receive an electronic component.

17. The printed circuit board of claim 14 wherein the largest dimension is smaller than half a wavelength of EMI emissions from the electronic component.

18. The printed circuit board of claim 14 wherein the first surface comprises at least one mechanical connector that electrically couples a conductive portion of the shield to the network of conductive elements.

19. The printed circuit board of claim 18 wherein the mechanical connector comprises a conductive or nonconductive adhesive.

20. The printed circuit board of claim 18 wherein the mechanical connector comprises a groove in the first surface, wherein the groove is sized to receive a portion of an EMI shield.

21. The printed circuit board of claim 14 wherein the shield comprises a metal can.

22. The printed circuit board of claim 14 wherein the shield is coupled to a ground trace positioned on the first external surface, wherein the ground trace is in electrical communication with at least some of the conductive elements.

23. The printed circuit board of claim 14 wherein the conductive elements make direct contact with a flange of the shield.

24. The printed circuit board of claim 23 wherein a conductive element is disposed on a portion of the conductive elements to create an electrical connection to the shield positioned on the first external surface.

25. The printed circuit board of claim 23 wherein the conductive element comprises conductive adhesive.

26. An electronic device comprising the PCB of claim 14.

27. The printed circuit board of claim 14 wherein at least one of said conductive elements is located below said electronic component.

28. A method of shielding an electronic component on a printed circuit board (PCB), the method comprising:

providing a PCB that comprises an electronic component on a first surface of the PCB and one or more grounded layers, and a plurality of conductive vias that extend from the first surface to at least one of the grounded layers;

coupling a metallized polymer shield to the first surface of the PCB and around the electronic component to create an electrical connection to the conductive vias and the grounded layer(s), wherein the electrical connection between the grounded layer(s), vias, and the metallized polymer shield forms a grounded EMI shield that substantially surrounds the electronic component;

wherein adjacent conductive vias are spaced within the PCB a distance that is small enough to reduce a passage of electromagnetic radiation from the electronic component through the spacing between the adjacent conductive vias;

wherein the metallized polymer shield comprises a shaped polymer substrate that provides a cavity that is sized and shaped to receive the electronic component, wherein the shaped polymer substrate comprises a flange that extends around at least a portion of a perimeter of the cavity in a direction that is substantially parallel to the first surface of the PCB; and a metal layer disposed over at least one surface of the shaped polymer substrate.

29. The method of claim 28 comprising placing the PCB in a housing of an electronic device.

30. The method of claim 28 wherein the metallized polymer shield is removably coupled to the first surface of the PCB.

31. The method of claim 28 wherein the metallized polymer shield is coupled to the conductive vias through a ground trace on the first surface of the PCB.

32. The method of claim 28 comprising positioning a conductive adhesive between the metallized polymer shield and the first surface before the metallized polymer shield is coupled to the first surface of the PCB.

33. The method of claim 28 further comprising creating openings in a flange of the metallized polymer shield that correspond to the position of the vias on the PCB; and placing a conductive element over the openings to create a conductive path between a metal layer on the metallized polymer shield and the vias.

34. The method of claim 28 wherein providing a PCB comprises forming the vias in the PCB, wherein the vias are conductively coated or filled and are in a spaced configuration that has a largest distance between an adjacent via that is smaller than half a wavelength of the electromagnetic radiation that is emitted from the electronic component.

35. The method of claim 28 wherein at least one of the grounded layers comprises a ground plane.

36. The method of claim 28 wherein providing a PCB comprises forming a groove in the first surface of the PCB.

37. The method of claim 20 wherein said providing a PCB further comprises providing at least one of said plurality of conductive vias to be located below said PCB.

* * * * *